(12) United States Patent
Lin et al.

(10) Patent No.: US 11,647,682 B2
(45) Date of Patent: May 9, 2023

(54) MEMORY ARRAY, SEMICONDUCTOR CHIP AND MANUFACTURING METHOD OF MEMORY ARRAY

(71) Applicant: Taiwan Semiconductor Manufacturing Company, Ltd., Hsinchu (TW)

(72) Inventors: Yu-Chao Lin, Hsinchu (TW); Jung-Piao Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 17/382,372

(22) Filed: Jul. 22, 2021

(65) Prior Publication Data

US 2022/0367796 A1 Nov. 17, 2022

Related U.S. Application Data

(60) Provisional application No. 63/188,455, filed on May 14, 2021.

(51) Int. Cl.
*H01L 45/00* (2006.01)
*H01L 27/24* (2006.01)

(52) U.S. Cl.
CPC ......... *H01L 45/12* (2013.01); *H01L 27/2409* (2013.01); *H01L 27/2463* (2013.01); *H01L 45/16* (2013.01)

(58) Field of Classification Search
CPC ...................................................... H01L 45/00
See application file for complete search history.

(56) References Cited

U.S. PATENT DOCUMENTS

| | | | | |
|---|---|---|---|---|
| 2017/0170394 | A1* | 6/2017 | Chen | H01L 45/1233 |
| 2019/0181341 | A1* | 6/2019 | Choi | H01L 45/1233 |
| 2019/0334084 | A1* | 10/2019 | Ou Yang | H01L 45/1675 |
| 2020/0098988 | A1* | 3/2020 | Kim | H01L 45/1675 |

* cited by examiner

*Primary Examiner* — Marvin Payen
(74) *Attorney, Agent, or Firm* — JCIPRNET

(57) ABSTRACT

A memory array, a semiconductor chip and a method for forming the memory array are provided. The memory array includes first signal lines, second signal lines and memory cells. The first signal lines extend along a first direction. The second signal lines extend along a second direction over the first signal lines. The memory cells are defined at intersections of the first and second signal lines, and respectively include a resistance variable layer, a switching layer, an electrode layer and a carbon containing dielectric layer. The switching layer is overlapped with the resistance variable layer. The electrode layer lies between the resistance variable layer and the switching layer. The carbon containing layer laterally surrounds a stacking structure including the resistance variable layer, the switching layer and the electrode layer.

20 Claims, 22 Drawing Sheets

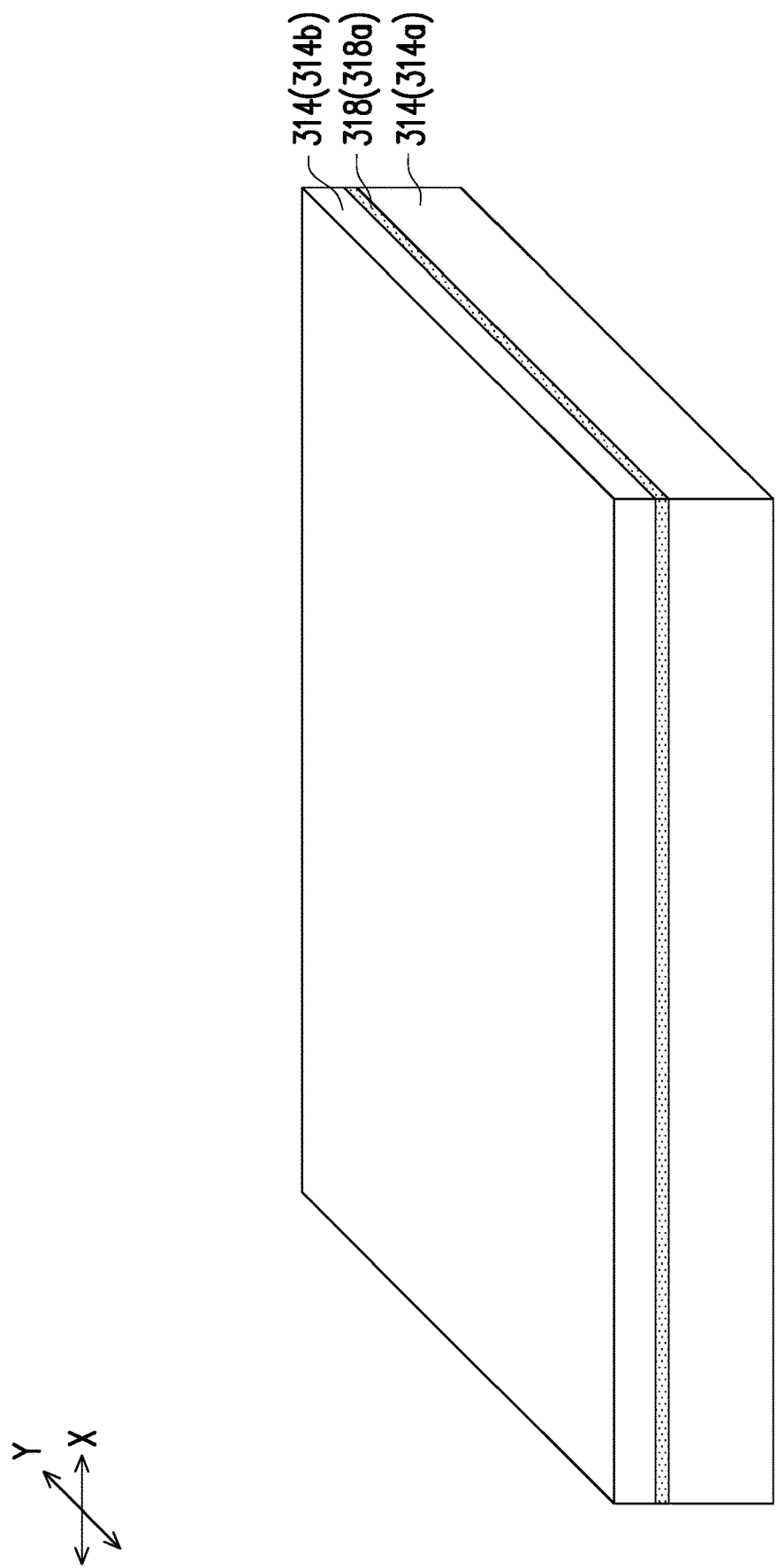

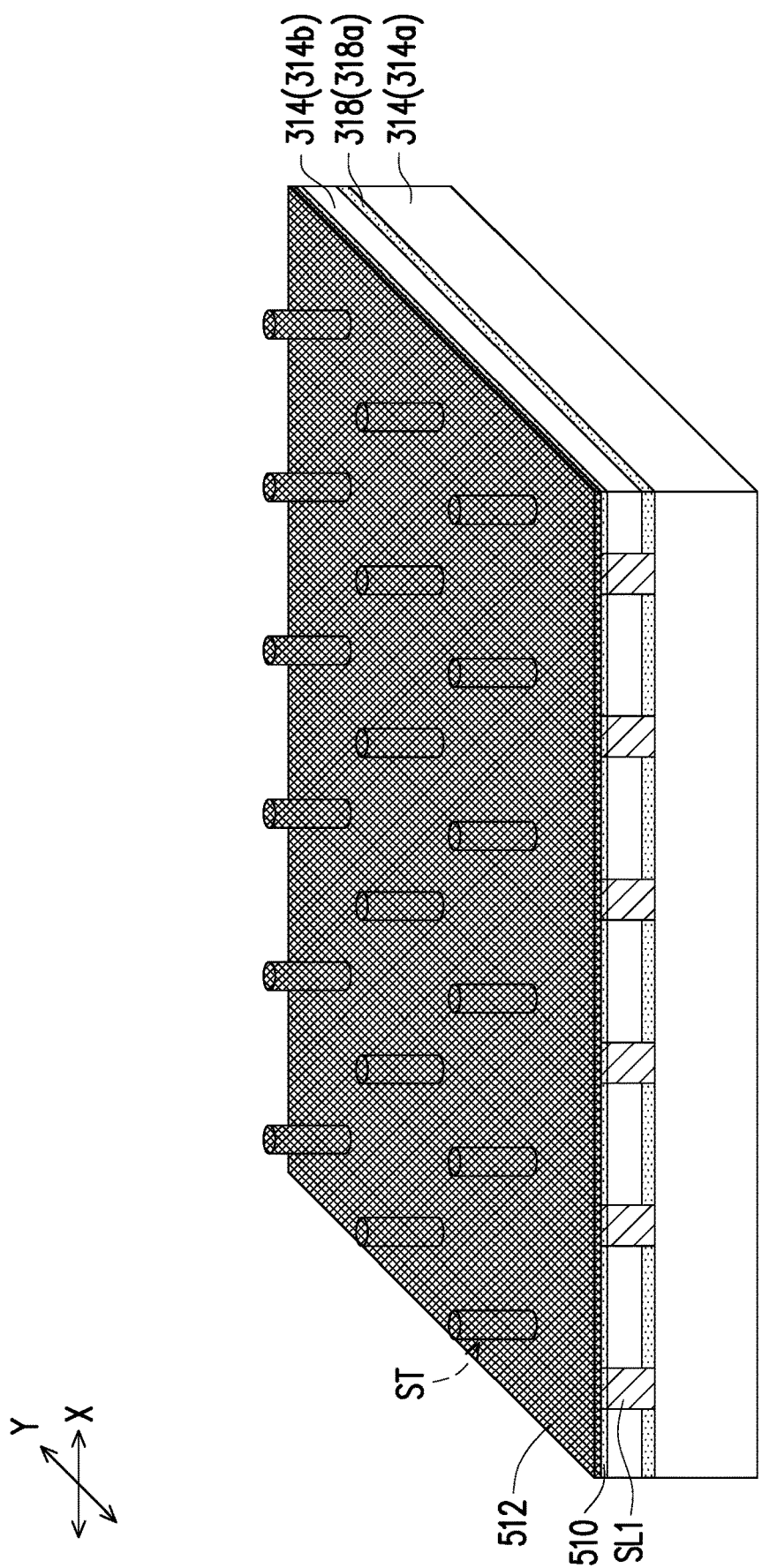

US 11,647,682 B2

MEMORY ARRAY, SEMICONDUCTOR CHIP AND MANUFACTURING METHOD OF MEMORY ARRAY

CROSS-REFERENCE TO RELATED APPLICATION

This application claims the priority benefit of U.S. provisional application Ser. No. 63/188,455, filed on May 14, 2021. The entirety of the above-mentioned patent application is hereby incorporated by reference herein and made a part of this specification.

BACKGROUND

With advances in digital technology, there is a greater demand for a nonvolatile memory device with higher capacity, less writing power, higher writing/reading speed, and longer service life. In order to meet the demand, refinement of a flash memory has been progressed. On the other hand, a nonvolatile memory device including memory cells each having a resistance variable element has been researched and developed.

Mostly, each of these nonvolatile memories has field effect transistors (FETs) that connect and disconnect the resistance variable elements from a driving circuit. The FETs have high on/off ratio and prevent leakage current from passing through the unselected memory cells. However, since a FET is a three-terminal device, such configuration of controlling access of the resistance variable elements by the FETs can significantly limit design flexibility and integration level in creating these nonvolatile memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A through FIG. 5L are schematic three-dimensional views illustrating intermediate structures at various stages during formation of the memory array as shown in FIG. 4.

DETAILED DESCRIPTION

Figure 1A:
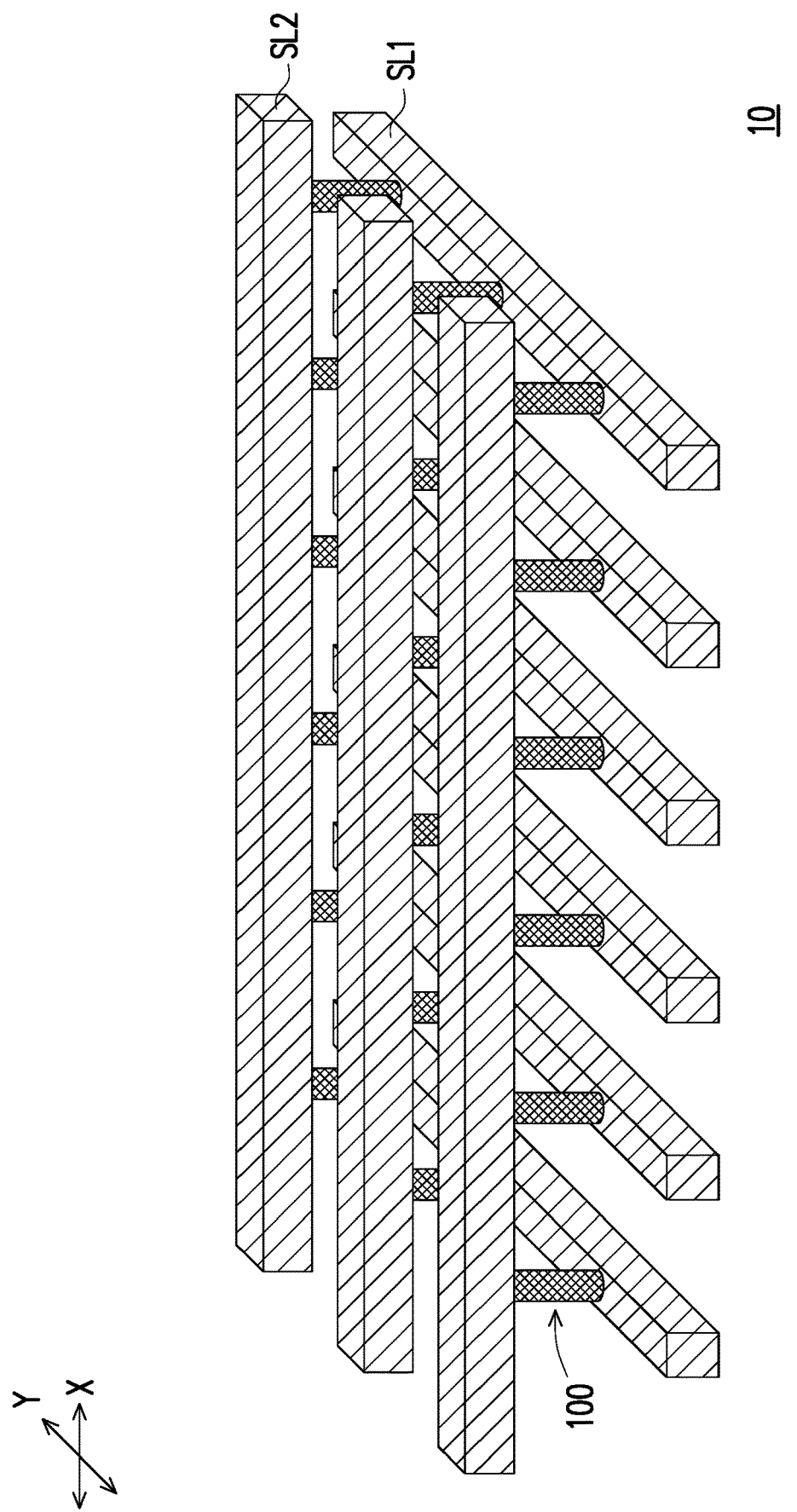
FIG. 1A is a schematic three-dimensional view illustrating a memory array, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic three-dimensional view illustrating a memory array 10, according to some embodiments of the present disclosure.

Referring to FIG. 1A, the memory array 10 includes memory cells 100 arranged along columns and rows. Each column of the memory cells 100 are arranged along a direction Y, while each row of the memory cells 100 are arranged along a direction X intersected with the direction Y. The memory cells 100 are defined between first signal lines SL1 and second signal lines SL2 running over the first signal lines SL1. A bottom end of each memory cell 100 is coupled to one of the first signal lines SL1, and a top end of each memory cell 100 is coupled to one of the second signal lines SL2. The first signal lines SL1 may be referred as bit lines, while the second signal lines SL2 may be referred as word lines. Alternatively, the first signal lines SL1 may be referred as word lines, while the second signal lines SL2 may be referred as bit lines. In some embodiments, each memory cell 100 is positioned at an intersection (or referred as a cross-point) of one of the first signal lines SL1 and one of the second signal lines SL2. In these embodiments, the first signal lines SL1 may extend along the direction Y, and the second signal lines SL2 may extend along the direction X. In addition, each column of the memory cells 100 may share one of the first signal lines SL1, and each row of the memory cells 100 may share one of the second signal lines SL2. In other words, each first signal line SL1 may be coupled to the bottom ends of a column of the memory cells 100, and each second signal line SL2 may be coupled to the top ends of a row of the memory cells 100.

Figure 1B:
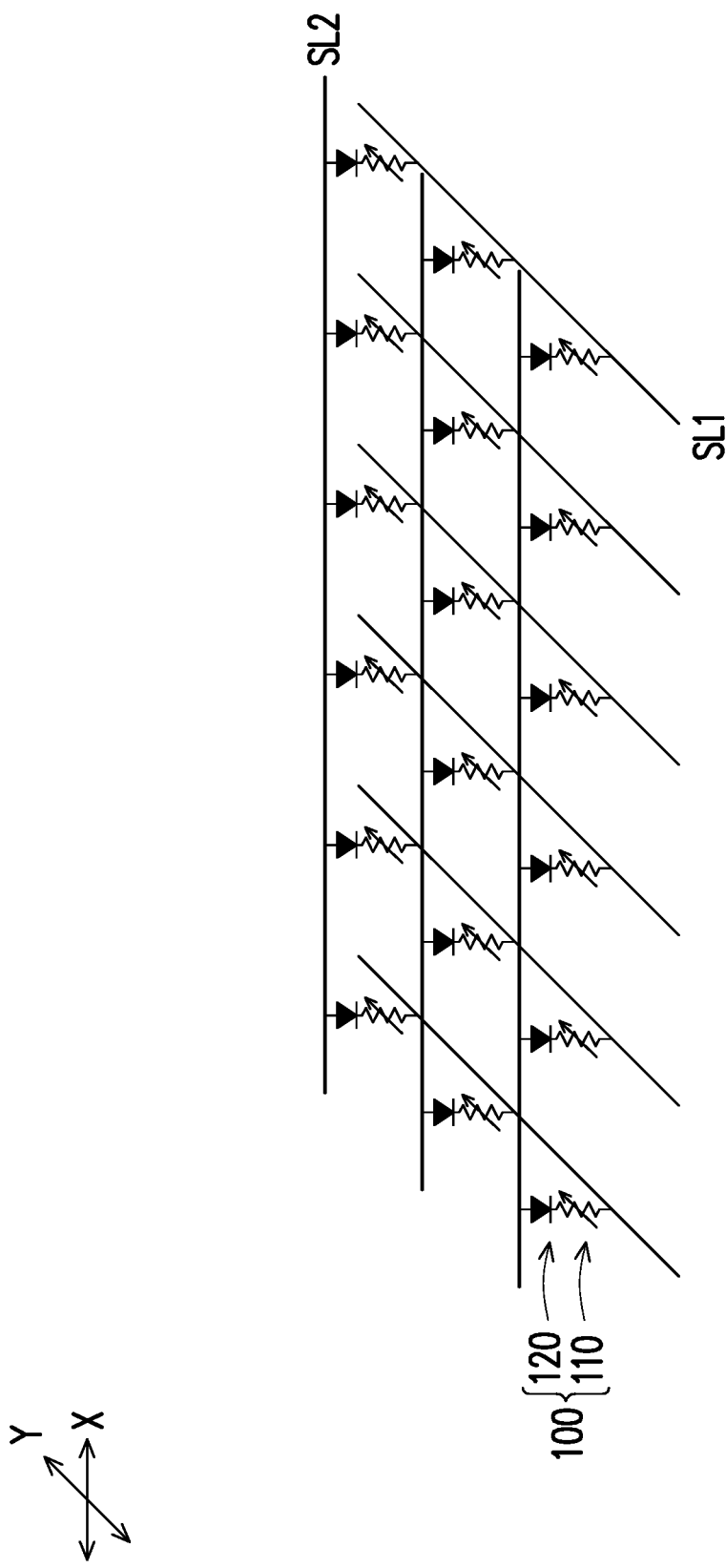
FIG. 1B is a circuit diagram illustrating an equivalent circuit of the memory array as shown in FIG. 1A.

FIG. 1B is a circuit diagram illustrating an equivalent circuit of the memory array 10.

Referring to FIG. 1A and FIG. 1B, each memory cell 100 includes a resistance variable element 110 and a selector 120. The resistance variable element 110 may be a two-terminal device. An electrical resistance across the resistance variable element 110 can be altered by changing polarity of a programming electrical signal provided to the resistance variable element 110 by the corresponding first and second signal lines SL1, SL2. In this way, the resistance variable element 110 can be programmed with a low resistance state or a high resistance state, and a logic data "0" or a logic data "1" can be stored in the resistance variable element 110. Further, the stored data can be kept even when the programming electrical signal is turned off, and the resistance variable element 110 can be described as a nonvolatile memory element. The programming electrical signal may be an input current provided to the resistance variable element 110, or a voltage bias applied across the resistance variable element 110. In some embodiments, the electrical resistance of the resistance variable element 110 is altered by formation/destruction of a conductive path (or referred as a filament) in the resistive variable element 110, and the memory array 10 including the memory cells 100 each having the resistance variable element 110 may be a resistive random access memory (RRAM). In other embodiments, the electrical resistance of the resistance variable element 110 is altered by changing crystallinity of a material layer in the resistance variable element 100, and the memory array 10 including the memory cells 100 each having the resistance variable element 110 may be a phase change random access memory (PCRAM).

The selector 120 coupled to the resistance variable element 110 is a two-terminal device as well. As a result of current-voltage (IV) nonlinear characteristic of the selector 120, the selector 120 may be turned on and act like a conductor when a voltage bias across the selector 120 is greater than a threshold voltage, and may be in an off state and act like an insulator when the voltage bias is less than the threshold voltage. Accordingly, the resistance variable element 110 may be coupled to the corresponding first and second signal lines SL1, SL2 when the selector 120 is turned on, and may be decoupled from one of the first and second signal lines SL1, SL2 connected to the selector 120 when the selector 120 is in an off state. In other words, the selector 120 may be functioned as an access switch of the resistance variable element 110. As examples, the selector 120 is a tunneling layer based selector, a mixed ionic electronic conduction (MIEC) selector, a metal insulator transition (MIT) selector, a threshold vacuum switch (TVS) selector, a volatile conductive-bridging random access memory (CBRAM) type selector, an ovonic threshold switching (OTS) selector or the like. As shown in FIG. 1B, the resistance variable element 110 and the selector 120 may be coupled together by a common terminal. For instance, the selector 120 may be disposed on the resistance variable element 110, and coupled to the resistance variable element 110 through a common terminal shared by the selector 120 and the resistance variable element 110. By controlling the selector 120, the resistance variable element 110 may be coupled to or decoupled from the second signal line SL2 connected to the selector 120. Alternatively, the selector 120 may be disposed below the resistance variable element 110. In these alternative embodiments, by controlling the selector 120, the resistance variable element 110 may be coupled to or decoupled to the first signal line SL1 connected to the selector 120.

Figure 2A:
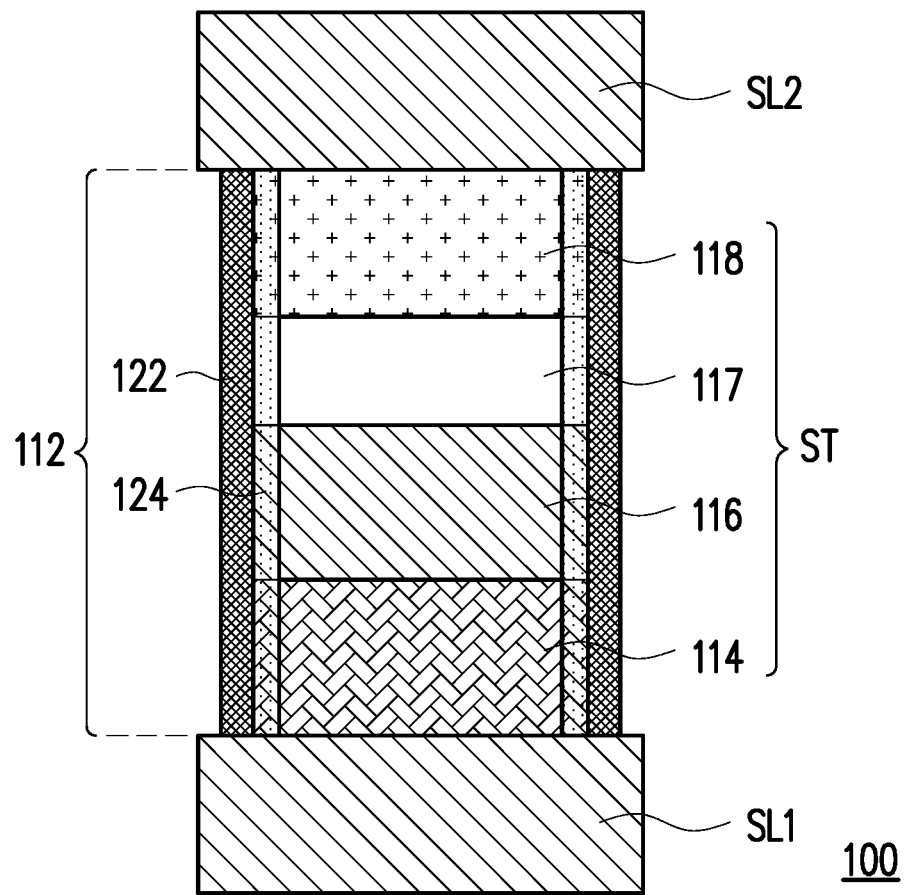
FIG. 2A is a schematic cross-sectional view of a memory cell defined between a first signal line and a second signal line, according to some embodiments of the present disclosure.

FIG. 2A is a schematic cross-sectional view of each memory cell 100 defined between the corresponding first and second signal lines SL1, SL2 as shown in FIG. 1A.

Referring to FIG. 1A and FIG. 2A, the memory cell 100 defined between one of the first signal lines SL1 and one of the second signal lines SL2 includes a pillar structure 112. The pillar structure 112 includes multiple layers stacked along a vertical direction, and is disposed between the first signal line SL1 and the second signal line SL2. The pillar structure 112 includes a resistance variable layer 114 as a data storage layer of the resistance variable element 110, and may include an electrode layer 116 as a common terminal of the resistance variable element 110 and the selector 120. In some embodiments, a portion of the first signal line SL1 overlapped with the pillar structure 112 is functioned as the other terminal of the resistance variable element 110. In these embodiments, the resistance variable element 110 is defined by the resistance variable layer 114, the electrode layer 116 and the portion of the first signal line SL1. The resistance variable layer 114 may be a single layer, or includes multiple sublayers stacked along the vertical direction. In those embodiments where the memory array 10 is a RRAM, the resistance variable layer 114 may be formed of hafnium oxide ($HfO_x$), zirconium oxide ($ZrO_x$) or the like, or may include a stack of sublayers each formed of one of these materials. In those embodiments where the memory array 10 is a PCRAM, the resistance variable layer 114 may be formed of GeTe, InSe, SbTe, GaSb, InSb, AsTe, AlTe, GeSbTe, TeGeAs, InSbTe, TeSnSe, GeSeGa, BiSeSb, GaSeTe, SnSbTe, InSbGe, TeGeSbS, TeGeSnO, TeGeSnAu, PdTeGeSn, InSeTiCo, GeSbTePd, GeSbTeCo, SbTeBiSe, AgInSbTe, GeSbSeTe, GeSnSbTe, GeTeSnNi, GeTeSnPd, GeTeSnPt, transition metal oxide materials, binary alloys (e.g., including transition metals, alkaline earth metals, and/or rare earth metals) or combinations thereof. As an example, a thickness of the resistance variable layer 114 may range from 5 nm to 20 nm. On the other hand, the electrode layer 116 and the first signal line SL1 are respectively formed of a conductive material. For instance, the electrode layer 116 is formed of TiN, Ta, TaN, Ru or combinations thereof, and the first signal line SL1 may be formed of Al—Cu alloy, W, Cu, TiN, TaN, Ru, AlN, Co or combinations thereof. In some embodiments, a thickness of the electrode layer 116 ranges from 10 nm to 20 nm, while a thickness of the first signal line SL1 ranges from 20 to 50 nm.

The pillar structure 112 further includes a switching layer 118. The switching layer 118 is functioned as an active layer of the selector 120, and may exhibit the IV nonlinear characteristic while sweeping a voltage applied to the switching layer 118. In some embodiments, the switching layer 118 is stacked over the electrode layer 116, which may be functioned as the common terminal of the resistance variable element 110 and the selector 120. In addition, a portion of the second signal line SL2 overlapped with the pillar structure 112 may be functioned as the other terminal of the selector 120. In this way, the selector 120 may be defined by the switching layer 118, the electrode layer 116 and the portion of the second signal line SL2. The switching layer 118 may be a single layer, or includes multiple sublayers stacked along the vertical direction. In some embodiments, the switching layer 118 is formed of GeTe, GeCTe, AsGeSe, GeSbTe, GeSiAsTe, GeSe, GeSbSe, GeSi-AsSe, GeS, GeSbS, GeSiAsS, the like, or combinations thereof. Alternatively, the selector layer 118 may include BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, BCSiTeON, the like or combinations thereof. As an example, a thickness of the switching layer 118 may range from 3 nm to 10 nm. On the other hand, the second signal line SL2 is formed of a conductive material the same or different from the conductive material of the first signal line SL1. For instance, the second signal line SL2 may be formed of Al—Cu alloy, W, Cu, TiN, TaN, Ru, AlN, Co or combinations thereof. In some embodiments, a thickness of the second signal line SL2 ranges from 20 to 50 nm.

In some embodiments, an adhesive layer 117 is formed between the electrode layer 116 and the switching layer 118, in order to improve adhesion between the electrode layer 116 and the switching layer 118. The adhesive layer 117 may be formed of a conductive material, and the electrode layer 116 as well as the adhesive layer 117 may be collectively functioned as the common terminal of the resistance variable element 110 and the selector 120. For instance, the adhesive layer 117 may be formed of a tungsten-based material, such as tungsten, tungsten oxide, tungsten nitride or the like. In some embodiments, a thickness of the adhesive layer 117 ranges from 3 to 10 nm.

The pillar structure 112 further includes a carbon containing dielectric layer 122 defining a sidewall of the pillar structure 112. In some embodiments, the carbon containing dielectric layer 122 laterally surrounds a stacking structure ST including the resistance variable layer 114, the electrode layer 116 and the switching layer 118 (or further including the adhesive layer 117). The carbon containing dielectric layer 122 has an ultra-low dielectric constant (k), which may be even lower than a low-k material such as fluorinated silicon glass (FSG or SiOF), phosphosilicate glass(PSG), carbon doped oxide dielectric comprising Si, C, O and H (SiCOH), hydrogen silsesquioxane (HSQ), methyl-silsesquioxane (MSQ), polyarylene ether (PAE), polyimide, parylene N, parylene F, teflon (PTFE), fluorinated amorphous carbon (a-C:F) or the like. In some embodiments, the carbon containing dielectric layer 122 is formed of porous SiCOH. In these embodiments, the carbon containing dielectric layer 122 may be amorphous, and may have a dielectric constant (k) substantially equal to or greater than 1.5, and less than 2, such as about 1.8. As to be further described, the carbon containing dielectric layer 122 may be formed in an etching apparatus. As compared to using a chemical vapor deposition (CVD) apparatus for depositing the carbon containing dielectric layer 122, using an etching apparatus for deposition of the carbon containing dielectric layer 122 may result in high porosity and low crystallinity of the carbon containing dielectric layer 122, due to low film density. Because of the high porosity and the low crystallinity, the carbon containing dielectric layer 122 may have an ultra-low dielectric constant. As shown in FIG. 1A and FIG. 2A, since the stacking structures ST of the memory cells 100 are each laterally surrounded by a carbon containing dielectric layer 122 with an ultra-low dielectric constant, a parasitic capacitance between these stacking structures ST can be effectively reduced. Accordingly, resistance-capacitance (RC) delay in the memory array 10 can be reduced. Further, the carbon containing dielectric layer 122 may protect the stacking structures ST from damages caused by moisture and etchants generated during manufacturing of the memory array 10. Therefore, a queue time during the manufacturing of the memory array 10 can be less limited. In some embodiments, a thickness of the carbon containing dielectric layer 122 ranges from about 1 nm to about 3 nm. If the thickness of the carbon containing dielectric layer 122 is less than about 1 nm, reduction of the parasitic capacitance and the protection from the moisture and etchant damages may not be effective. On the other hand, if the thickness of the carbon containing dielectric layer 122 is greater than about 3 nm, the carbon containing dielectric layer 122 may accidentally peel from the stacking structure ST. Further, if a total footprint area of the stacking structure ST and the carbon containing dielectric layer 122 is fixed, excessively increasing the thickness of the carbon containing dielectric layer 122 may result in reduction of a footprint area of the stacking structure ST, which may raise contact resistance between the stacking structure ST and the first and second signal lines SL1, SL2.

A boundary of the pillar structure 112 is defined by an outer sidewall of the carbon containing dielectric layer 122. In some embodiments, as shown in FIG. 2A, the boundary of the pillar structure 112 is slightly recessed from a boundary of the underlying first signal line SL1. In other embodiments, the boundary of the pillar structure 112 is substantially aligned with the boundary of the underlying first signal line SL1. In yet other embodiments, the boundary of the pillar structure 112 is laterally protruded from the boundary of the underlying first signal line SL1. Similarly, the boundary of the pillar structure 112 may be slightly recessed from a boundary of the overlying second signal line SL2, or alternatively be substantially aligned with or laterally protruded from the boundary of the overlying second signal line SL2.

In some embodiments, the stacking structure ST is subjected to nitridation before being covered by the carbon containing dielectric layer 122, and a nitride layer 124 may be formed in a peripheral region of the stacking structure ST. The nitride layer 124 may laterally extend into the stacking structure ST from the sidewall of the stacking structure ST, and may be laterally surrounded by the carbon containing dielectric layer 122. The nitride layer 124 can further protect the stacking structure ST (i.e., an inner portion of the stacking structure ST) from the moisture and etchants damages. Since the layers in the stacking structure ST may have different susceptibilities to nitridation, a thickness of the nitride layer 124 may vary among different layers of the stacking structure ST. As an example, the thickness of the nitride layer 124 may range from about 0.1 nm to about 1 nm. In other embodiments, the stacking structure ST is not subjected to nitridation, and a nitride layer at a peripheral region of the stacking structure ST may be absent.

Figure 2B:
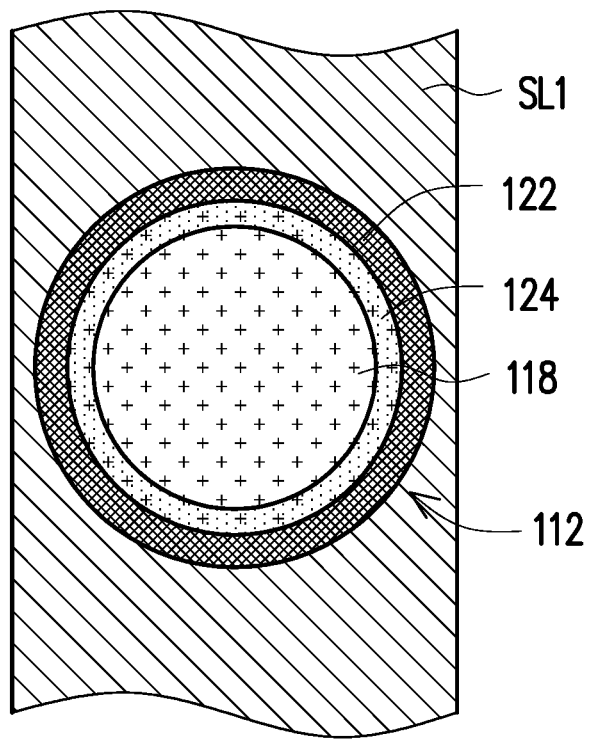
FIG. 2B is a schematic top view of a pillar structure as shown in FIG. 2A.

FIG. 2B is a schematic top view of the pillar structure 112 as shown in FIG. 2A.

Referring to FIG. 2A and FIG. 2B, in some embodiments, the pillar structure 112 standing on the first signal line SL1 is formed in a cylinder shape. In these embodiments, the carbon containing dielectric layer 122 and the nitride layer 124 may each appear as a circular ring when viewing from above the pillar structure 112. However, the pillar structure 112 may be alternatively formed in other shapes, the present disclosure is not limited to dimension and geometry of the pillar structure 112. In addition, as described above, the boundary of the pillar structure 112 may be within the boundary of the first signal line SL1, according to some embodiments. In alternative embodiments, the boundary of the pillar structure 112 may be substantially aligned with or laterally protruded from the boundary of the first signal line SL1.

Figure 3A:
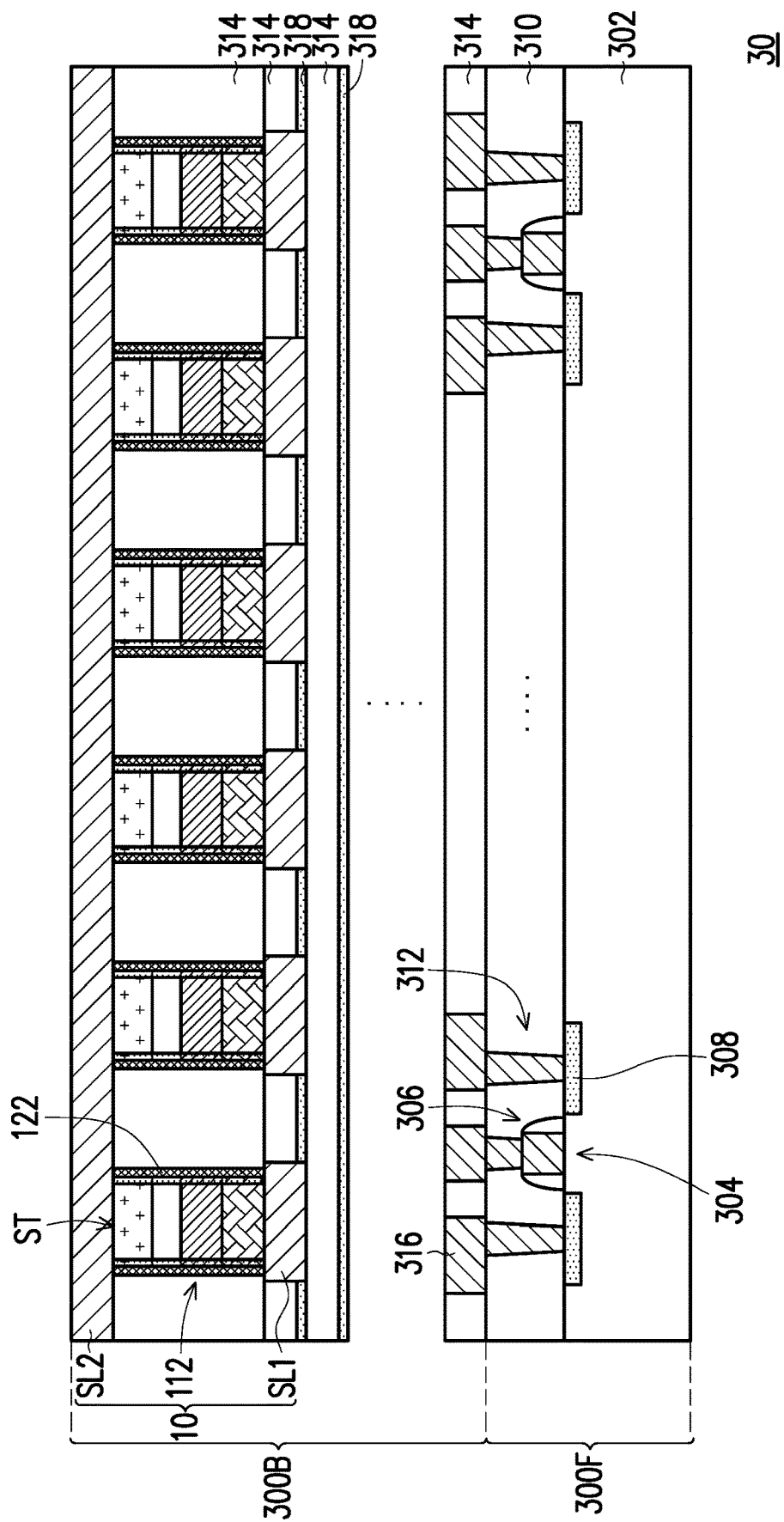
FIG. 3A is a schematic cross-sectional view of a semiconductor chip including a memory array along a word line, according to some embodiments of the present disclosure.
Figure 3B:
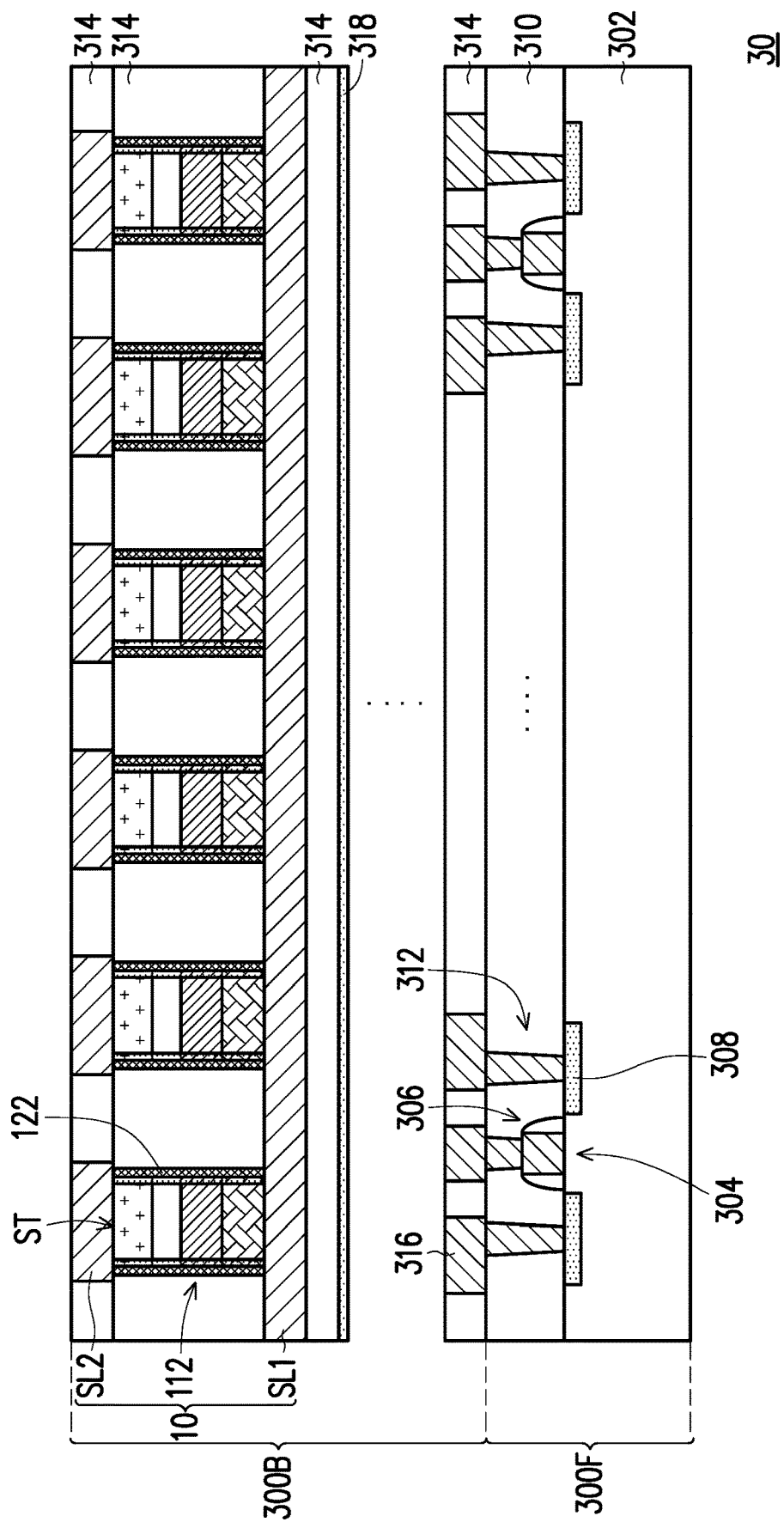
FIG. 3B is a schematic cross-sectional view of the semiconductor chip along a bit line of the memory array in the semiconductor chip, according to some embodiments of the present disclosure.

FIG. 3A is a schematic cross-sectional view of a semiconductor chip 30 including the memory array 10 along one of the word lines WL, according to some embodiments of the present disclosure. FIG. 3B is a schematic cross-sectional view of the semiconductor chip 30 including the memory array 10 along one of the bit lines BL, according to some embodiments of the present disclosure.

Referring to FIG. 3A and FIG. 3B, the memory array 10 may be formed in a semiconductor chip 30. The semiconductor chip 30 may include a front-end-of-line (FEOL) structure 300F and a back-end-of-line (BEOL) structure 300B stacked on the FEOL structure 300F. The FEOL structure 300F includes a semiconductor substrate 302 and active devices 304 formed at a front surface of the semiconductor substrate 302. The semiconductor substrate 302 may be a semiconductor wafer or a semiconductor-on-insulator (SOI) wafer. The active devices 304 may be field effect transistors (FETs), and each active device 304 may include a gate structure 306 and a pair of source/drain structures 308 at opposite sides of the gate structure 306. In some embodiments, the gate structure 306 may be disposed on a planar portion of the semiconductor substrate 302, and the source/drain structures 308 may be doped regions in the semiconductor substrate 302 or epitaxial structures formed in recesses at the front surface of the semiconductor substrate 302. In these embodiments, the active devices 304 may be planar-type FETs. In alternative embodiments, the semiconductor substrate 302 may be shaped to form fin structures or vertically spaced separated nanosheets/nanorods at the front surface, and these fin structures or nanosheets/nanorods are intersected with and covered by the gate structures 306. In these alternative embodiments, the active devices 304 may be fin-type FETs (finFETs) or gate-all-around FETs (GAA-FETs). However, the present disclosure is not limited to types of the FETs, and the FEOL structure 300F may further include other active devices and/or passive devices formed at the front surface of the semiconductor substrate 302. Moreover, the FEOL structure 300F may further includes a dielectric layer 310 and contact plugs 312 formed in the dielectric layer 310. The active devices 304 are covered by the dielectric layer 310. The contact plugs 312 extend from the gate structures 306 and the source/drain structures 308 to a top surface of the dielectric layer 310.

The BEOL structure 300B may include a stack of interlayer dielectric layers 314. The memory array 10 may be formed in some of the interlayer dielectric layers 314, such that the first signal lines SL1, the pillar structures 112 and the second signal lines SL2 of the memory array 10 are respectively surrounded by one of the interlayer dielectric layers 314. The active devices 304 formed in the FEOL structure 300F lying below the BEOL structure 300B may or may not be overlapped with the memory array 10 embedded in the BEOL structure 300B. Although the memory array 10 is depicted in FIG. 3A and FIG. 3B as being embedded in topmost three interlayer dielectric layers 314, there may be actually more of the interlayer dielectric layers 314 stacked on the memory array 10, and the memory array 10 may be distant from the topmost interlayer dielectric layer 314. In addition, the BEOL structure 300B also includes interconnections 316 formed in the dielectric layers 314. Although only partially shown FIG. 3A and FIG. 3B, the interconnections 316 may spread below, aside and above the memory array 10, and configured to interconnect the active devices 304 and to out-rout the first and second signal lines SL1, SL2 of the memory array 10 to the active devices 304. As depicted in FIG. 3A and FIG. 3B, the interconnections 316 may include conductive pads or lines respectively extending in one of the interlayer dielectric layers 314. Although not shown, the interconnections 316 may also include conductive vias respectively penetrating through one or more of the interlayer dielectric layers 314 to establish electrical contact with conductive pads or lines at different horizontal levels. In some embodiments, the BEOL structure 300B further includes etching stop layers 318 respectively lining between some adjacent ones of the interlayer dielectric layers 314. For instance, as shown in FIG. 3A, an etching stop layer 318 may lie below the interlayer dielectric layer 314 in which the first signal lines SL1 are formed, and the first signal lines SL1 may penetrate through this etching stop layer 318 and extend to an underlying one of the interlayer dielectric layers 314.

Since the stacking structure ST in each pillar structure 112 is laterally surrounded by the carbon containing dielectric layer 122, the stacking structures ST in adjacent pillar structures 112 are separated from each other with the carbon containing dielectric layers 122 of these adjacent pillar structures 112 in between. Hence, in addition to a portion of one of the interlayer dielectric layers 314 spanning between the stacking structures ST in adjacent pillar structures 112, the carbon containing dielectric layers 122 in these adjacent pillar structures 112 also lie between these stacking structures ST. As a result of the ultra-low dielectric constant of the carbon containing dielectric layers 122, the parasitic capacitance between the stacking structures ST in adjacent pillar structures 122 can be reduced. In some embodiments, a dielectric constant each interlayer dielectric layer 314 is greater than the dielectric constant of the carbon containing dielectric layers 122. For instance, the dielectric constant of each interlayer dielectric layer 314 may range from about 3.0 to about 4.2, while the dielectric constant of the carbon containing dielectric layer 122 may be less than 2 (as described with reference to FIG. 2A). As examples, the carbon containing dielectric layers 122 may be formed of porous SiCOH, whereas the interlayer dielectric layers 314 may be respectively formed of silicon oxide, the aforementioned low-k materials or the like.

Furthermore, the semiconductor chip 30 may also include electrical connectors (not shown) formed on the BEOL structure 300B. The electrical connectors may be electrically connected to the interconnections 316 of the BEOL structure 300B, and may be functioned as chip inputs/outputs (I/Os) of the semiconductor chip 30.

Figure 4:
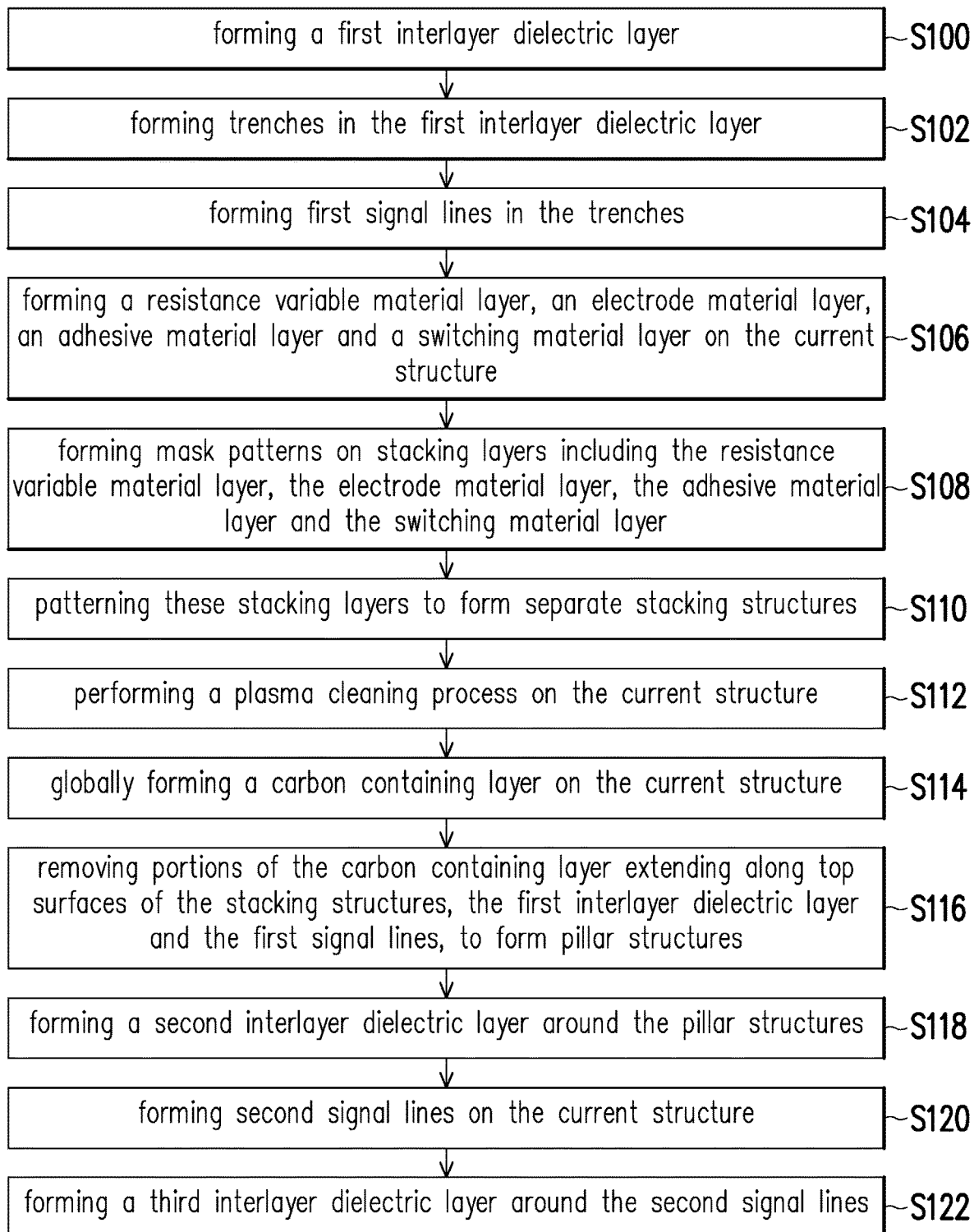
FIG. 4 is a flow diagram illustrating a method for forming a memory array during manufacturing process of a semiconductor chip, according to some embodiments of the present disclosure.

FIG. 4 is a flow diagram illustrating a method for forming the memory array 10 during manufacturing process of the semiconductor chip 30, according to some embodiments of the present disclosure. FIG. 5A through FIG. 5L are schematic three-dimensional views illustrating intermediate structures at various stages during formation of the memory array 10 as shown in FIG. 4.

Referring to FIG. 4 and FIG. 5A, step S100 is performed, and one of the interlayer dielectric layers 314 (referred as an interlayer dielectric layer 314b hereinafter) is formed on another one of the interlayer dielectric layers 314 (referred as an interlayer dielectric layer 314a hereinafter). As described with reference to FIG. 3A and FIG. 3B, the interlayer dielectric layers 314a, 314b (i.e., two of the interlayer dielectric layers 314) are portions of the BEOL structure 300B stacked on the FEOL structure 300F. In some embodiments, an etching stop layer 318 (referred as an etching stop layer 318a hereinafter) is formed on the interlayer dielectric layer 314a before formation of the interlayer dielectric layer 314b. The etching stop layer 318a may have sufficient etching selectivity with respect to the interlayer dielectric layers 314a, 314b. In some embodiments, the interlayer dielectric layers 314a, 314b and the etching stop layer 318a are respectively formed by a deposition process, such as a CVD process.

Figure 5B:
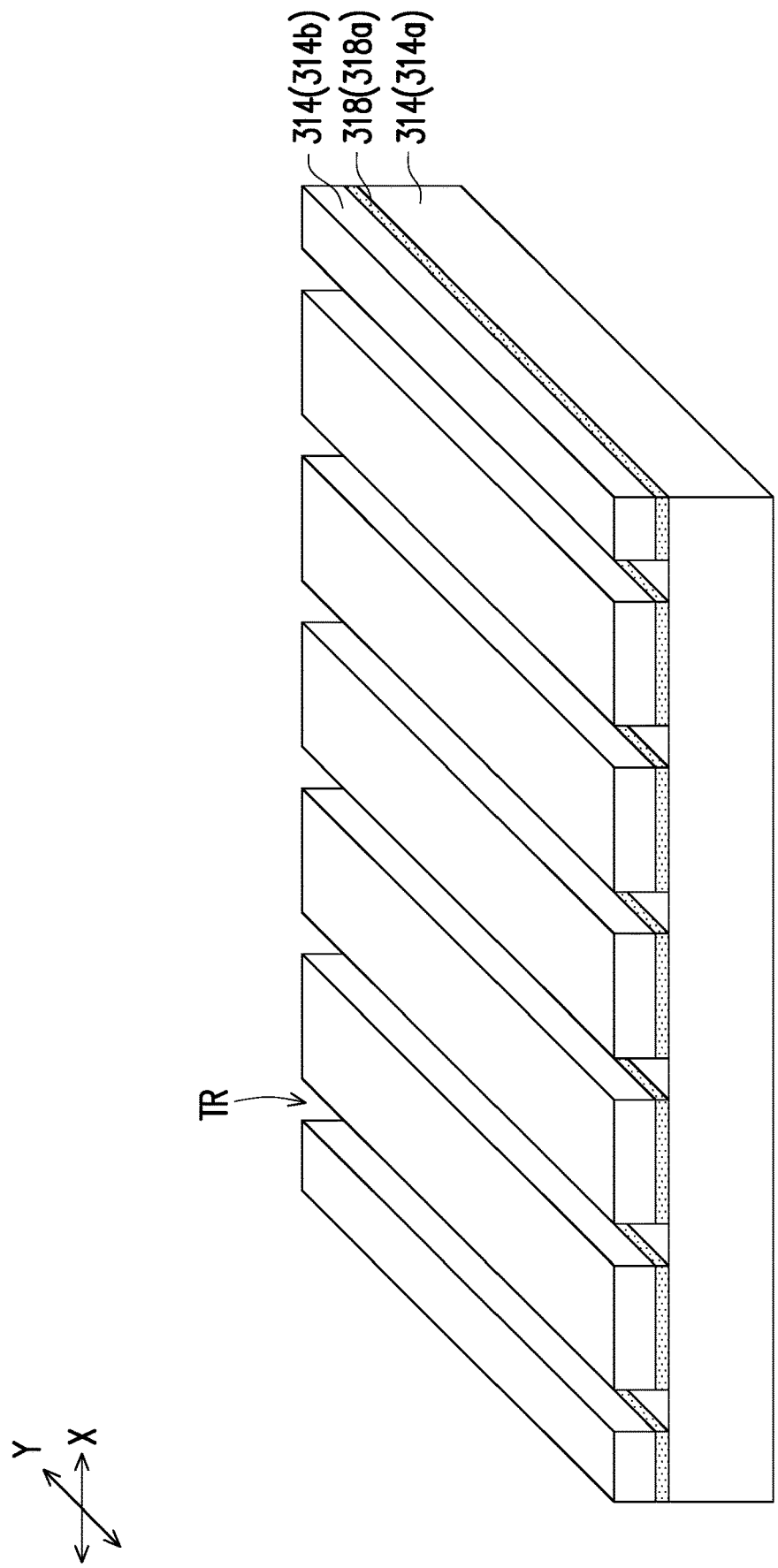

Referring to FIG. 4 and FIG. 5B, step S102 is performed, and trenches TR are formed in the interlayer dielectric layer 314b. The trenches TR penetrate through the interlayer dielectric layer 314b, and separately extend along the direction Y in the interlayer dielectric layer 314b. In those embodiments where the etching stop layer 318a is disposed between the interlayer dielectric layers 314a, 314b, the trenches TR may further penetrate through the etching stop layer 318a. A method for forming the trenches TR may include a lithography process and at least one etching process (e.g., an anisotropic etching process).

Figure 5C:
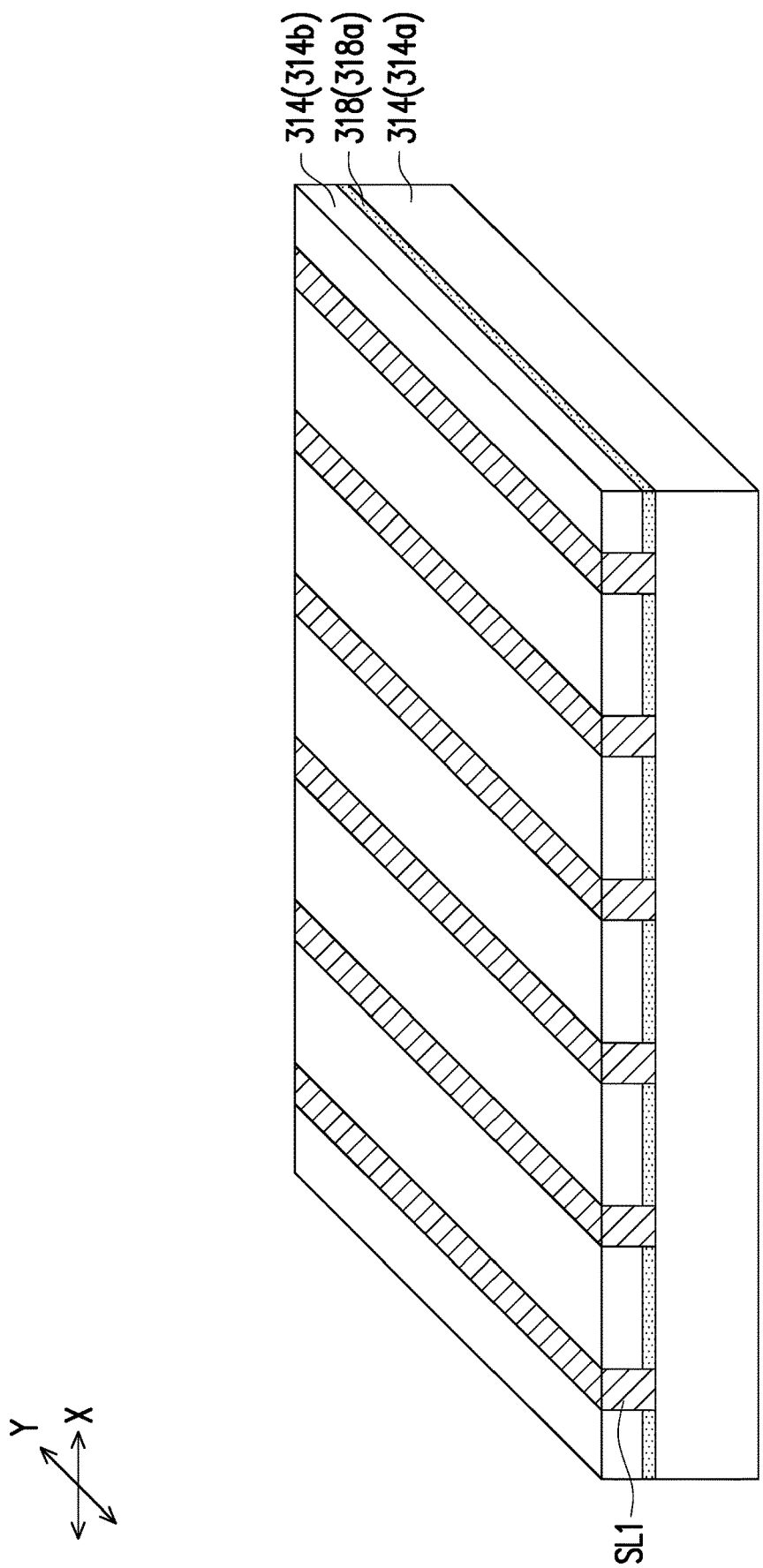

Referring to FIG. 4 and FIG. 5C, step S104 is performed, and the first signal lines SL1 are formed in the trenches TR. The trenches TR may be filled up by the signal lines SL1. In some embodiments, a method for forming the first signal lines SL1 includes providing a conductive material on the structure shown in FIG. 5B by a deposition process, a plating process or a combination thereof. Subsequently, portions of the conductive material above a top surface of the interlayer dielectric layer 314a is removed by a planarization process, and the remained portions of the conductive material in the trenches TR form the first signal lines SL1. For instance, the planarization process may include a polishing process, an etching process (e.g., an isotropic etching process) or a combination thereof.

Figure 5D:
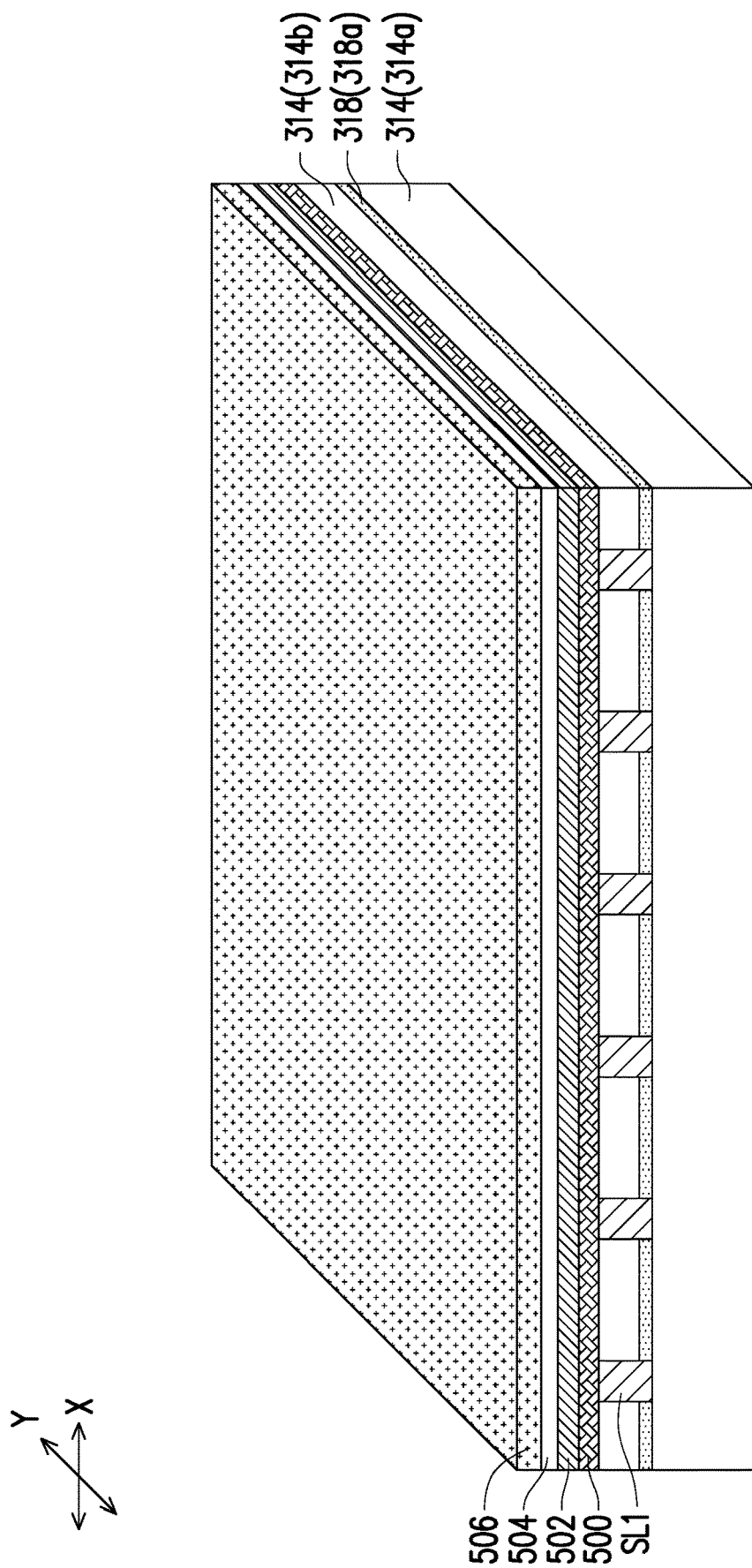

Referring to FIG. 4 and FIG. 5D, step S106 is performed, and a resistance variable material layer 500, an electrode material layer 502, an adhesive material layer 504 and a switching material layer 506 are formed on the current structure. The resistance variable material layer 500, the electrode material layer 502, the adhesive material layer 504 and the switching material layer 506 will be patterned to form the resistance variable layer 114, the electrode layer 116 the adhesive layer 117 and the switching layer 118 as described with reference to FIG. 2A, respectively. Currently, the resistance variable material layer 500, the electrode material layer 502, the adhesive material layer 504 and the switching material layer 506 globally cover the interlayer dielectric layer 314b and the first signal lines SL1. In some embodiments, the resistance variable material layer 500, the electrode material layer 502, the adhesive material layer 504 and the switching material layer 506 are respectively formed by a deposition process, such as a CVD process, a physical vapor deposition (PVD) process or an atomic layer deposition (ALD) process.

Figure 5E:
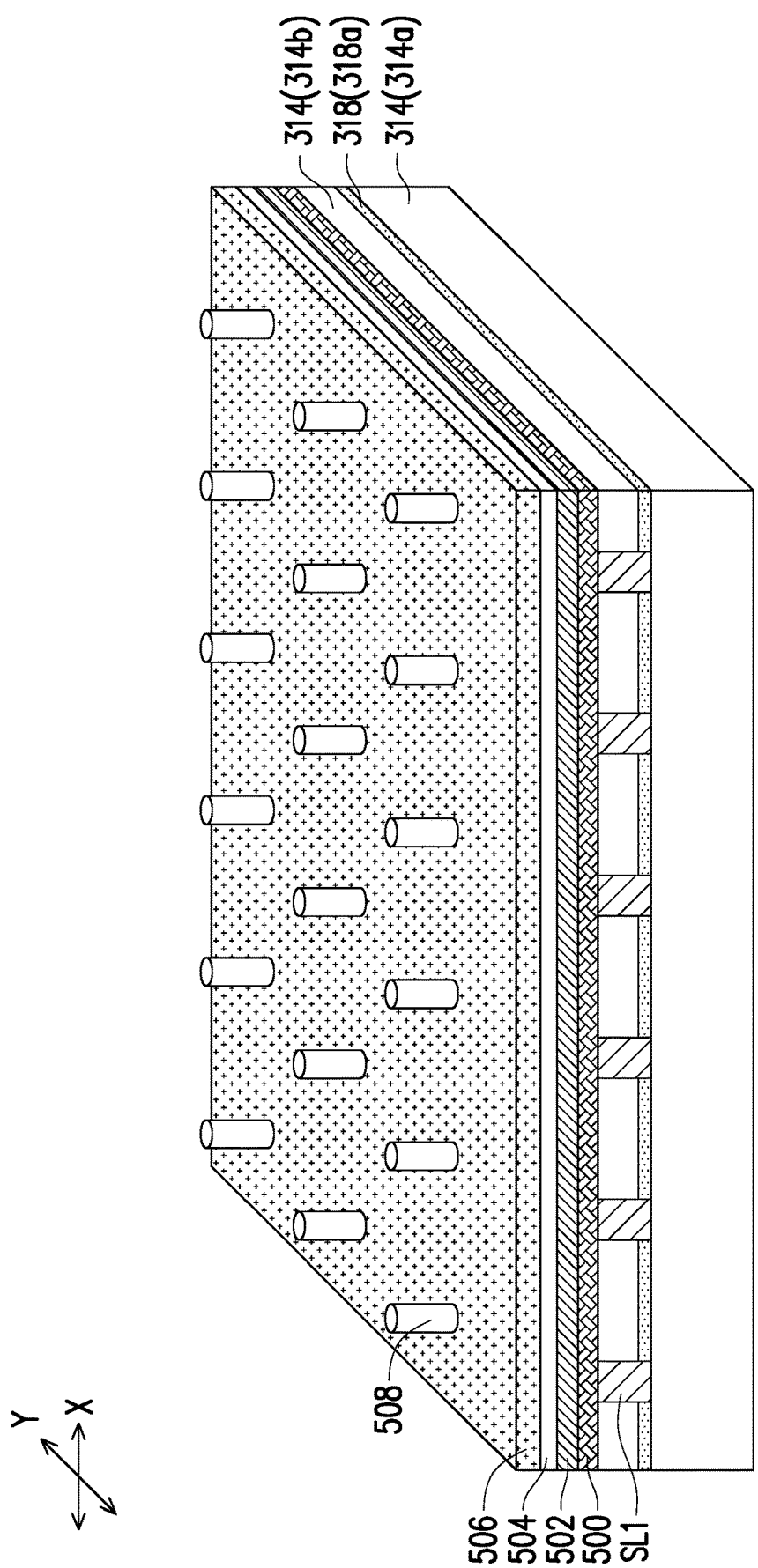

Referring to FIG. 4 and FIG. 5E, step S108 is performed, and mask patterns 508 are formed on stacking layers including the resistance variable material layer 500, the electrode material layer 502, the adhesive material layer 504 and the switching material layer 506. The mask patterns 508 will be functioned as shadow masks during patterning of these stacking layers in the following step. In other words, positions of the mask patterns 508 determine positions of these subsequently formed patterns, and the mask patterns 508 are formed in shapes of the patterns expected to be obtained. For instance, the mask patterns 508 are formed in pillar shapes. In some embodiments, the mask patterns 508 are photoresist patterns, and are formed by a lithography process.

Figure 5F:
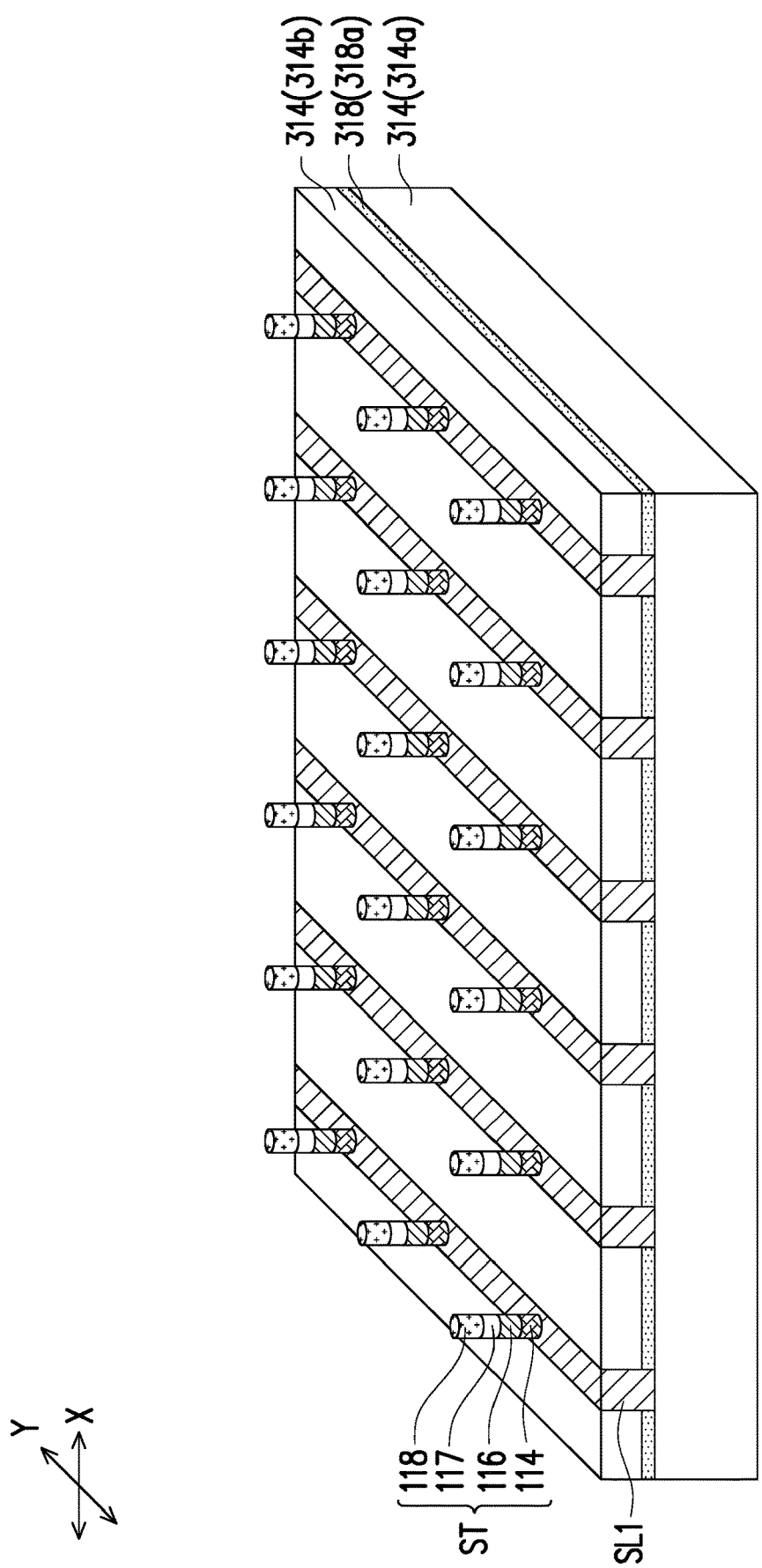

Referring to FIG. 4 and FIG. 5F, step S110 is performed, and the resistance variable material layer 500, the electrode material layer 502, the adhesive material layer 504 and the switching material layer 506 are patterned to form the stacking structures ST as described with reference to FIG. 2A. The resistance variable layer 114, the electrode layer 116, the adhesive layer 117 and the switching layer 118 in each stacking structure ST are a portion of the resistance variable material layer 500, a portion of the electrode material layer 502, a portion of the adhesive material 504 and a portion of the switching material layer 506, respectively. As described above, the mask patterns 508 are functioned as shadow mask in the current patterning step. Portions of the stacking layers not covered by the mask patterns 508 are removed by an etching process (e.g., an anisotropic etching process) performed in an etching apparatus. For instance, the etching apparatus may be an inductive coupling plasma (ICP) etching apparatus or a transformer coupling plasma (TCP) etching apparatus. On the other hand, portions of the stacking layers covered by the mask patterns 508 remain, and form the stacking structures ST. After formation of the stacking structures ST, the mask patterns 508 may be removed by a stripping process, an ashing process or the like.

Figure 5G:
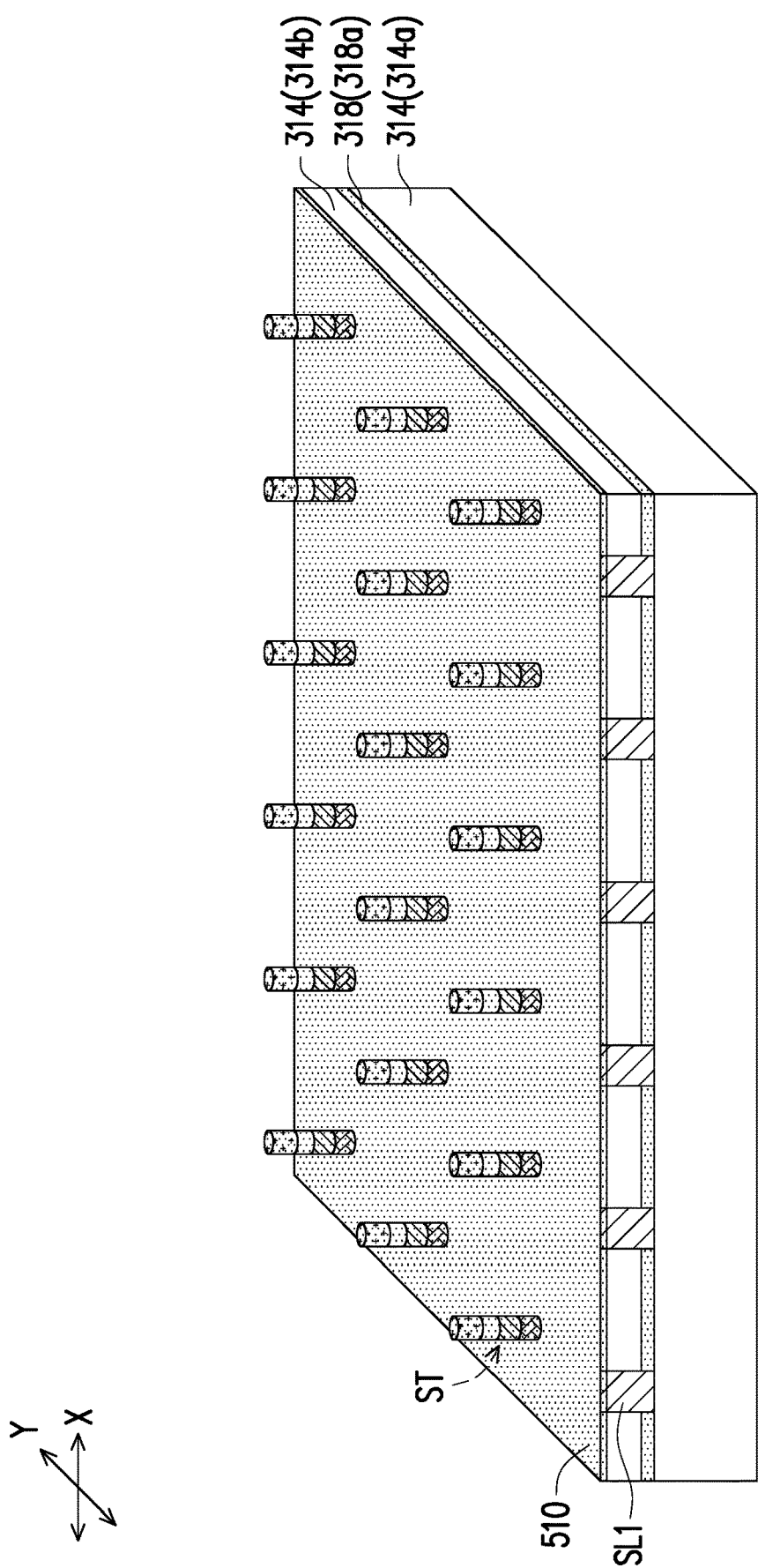

Referring to FIG. 4 and FIG. 5G, step S112 is performed, and a plasma cleaning process is performed on the current structure. In some embodiments, the plasma cleaning process is performed in the etching apparatus used for the previous patterning step as described with reference to FIG. 5F. Further, in some embodiments, a mixture of $N_2$ plasma and Ar plasma is generated in the etching apparatus for performing the plasma cleaning process. In these embodiments, the current structure may be subjected to nitridation from exposed surfaces, and a nitride layer 510 may be formed in a surface region of the current structure. The nitride layer 510 may be further patterned to form the nitride layers 124 each described with reference to FIG. 2A. Since exposed components in the current structure may have different susceptibilities to nitridation, a thickness of the nitride layer 510 may vary among different components in the current structure. In alternative embodiments, a mixture of $H_2$ plasma and Ar plasma is generated in the etching apparatus for performing the plasma cleaning process. In these alternative embodiments, the current structure may not be subjected to nitridation, and the nitride layer 510 may be absent.

Referring to FIG. 4 and FIG. 5H, step S114 is performed, and a carbon containing dielectric layer 512 is globally formed on the current structure. The carbon containing dielectric layer 512 will be patterned to form the carbon containing dielectric layers 122 each described with reference to FIG. 2A. Currently, the carbon containing dielectric layer 512 may conformally cover the stacking structures ST, the interlayer dielectric layer 314b and the first signal lines SL1. In those embodiments where the nitride layer 510 is previously formed, the nitride layer 510 may be entirely covered by the carbon containing dielectric layer 512. The carbon containing dielectric layer 512 may be formed by a deposition process performed in the etching apparatus used for previous patterning step as described with reference to FIG. 5F. By performing the deposition in the etching apparatus, the deposited carbon containing dielectric layer 512 may be amorphous and have high porosity, due to low film density. As a result the high porosity, the carbon containing dielectric layer 512 may have an ultra low dielectric constant. During the deposition of the carbon containing dielectric layer 512, a hydrocarbon source gas is provided to the etching apparatus, and is ionized then deposited onto a workpiece (e.g., the structure as shown in FIG. 5G) to form the carbon containing dielectric layer 512. In some embodiments, the hydrocarbon source gas includes methane (CH$_4$), ethyne (C$_2$H$_2$), ethene (C$_2$H$_4$), the like or combinations thereof.

Figure 5I:
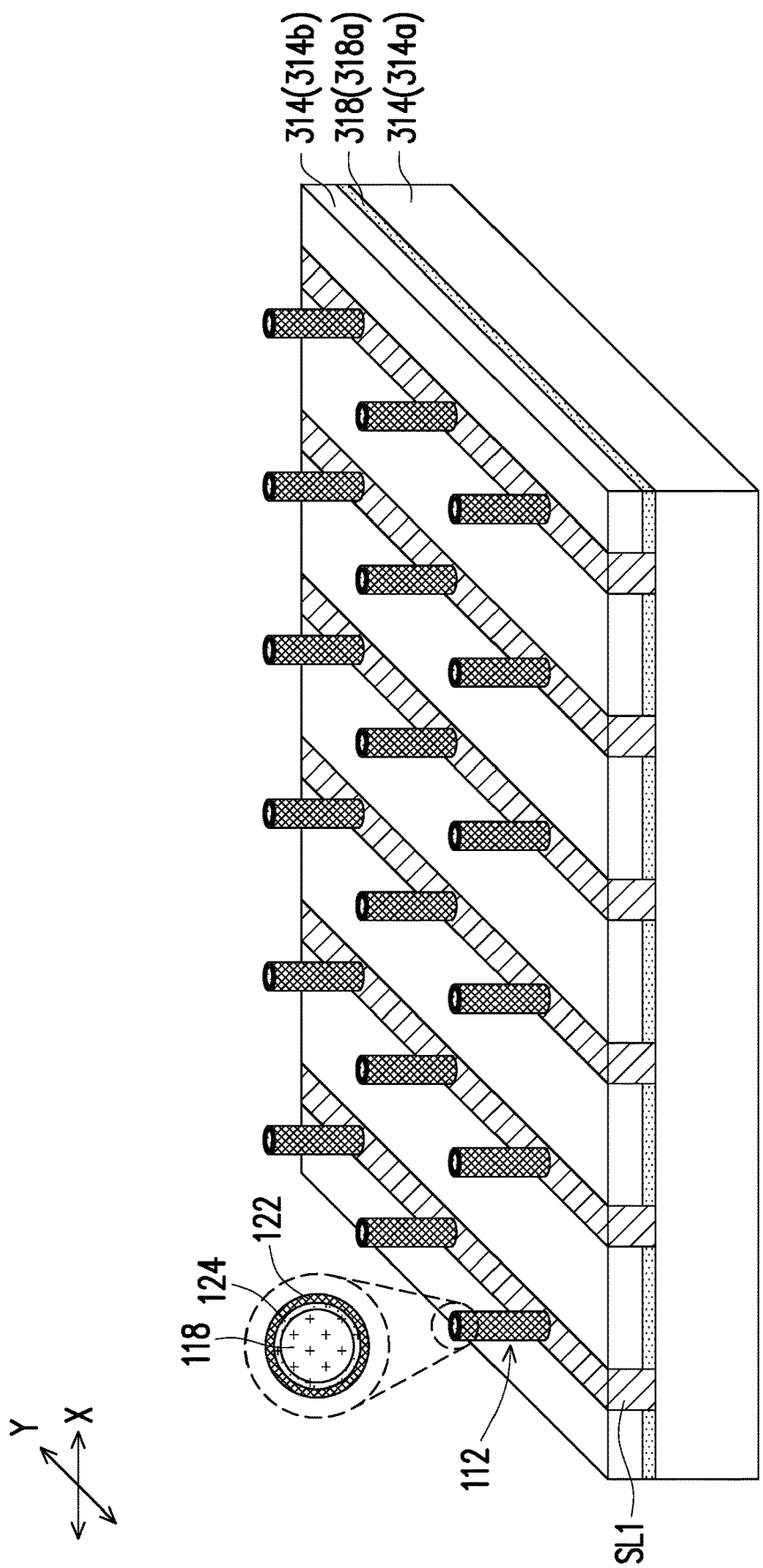

Referring to FIG. 4 and FIG. 5I, step S116 is performed, and portions of the carbon containing dielectric layer 512 extending along top surfaces of the stacking structures ST, the interlayer dielectric layer 314*b* and the firs signal lines SL1 are removed. Remained portions of the carbon containing dielectric layer 512 on sidewalls of the stacking structures ST form the carbon containing dielectric layers 122. In those embodiments where the nitride layer 510 is formed before formation of the carbon containing dielectric layer 512, portions of the nitride layer 510 extending along the top surfaces of the stacking structures ST, the interlayer dielectric layer 314*b* and the firs signal lines SL1 may be removed as well. Remained portions of the nitride layer 510 extending along the sidewalls of the stacking structures ST form the nitride layers 124. The stacking structures ST along with the carbon containing dielectric layers 122 (and the nitride layers 124) form the pillar structures 112. In addition, the top surfaces of the interlayer dielectric layer 314*b* and the first signal lines SL1 around the pillar structures 112 may be currently exposed. In some embodiments, a method for patterning the carbon containing dielectric layer 512 (and the nitride layer 510) includes an etching process, such as an anisotropic etching process.

Figure 5J:
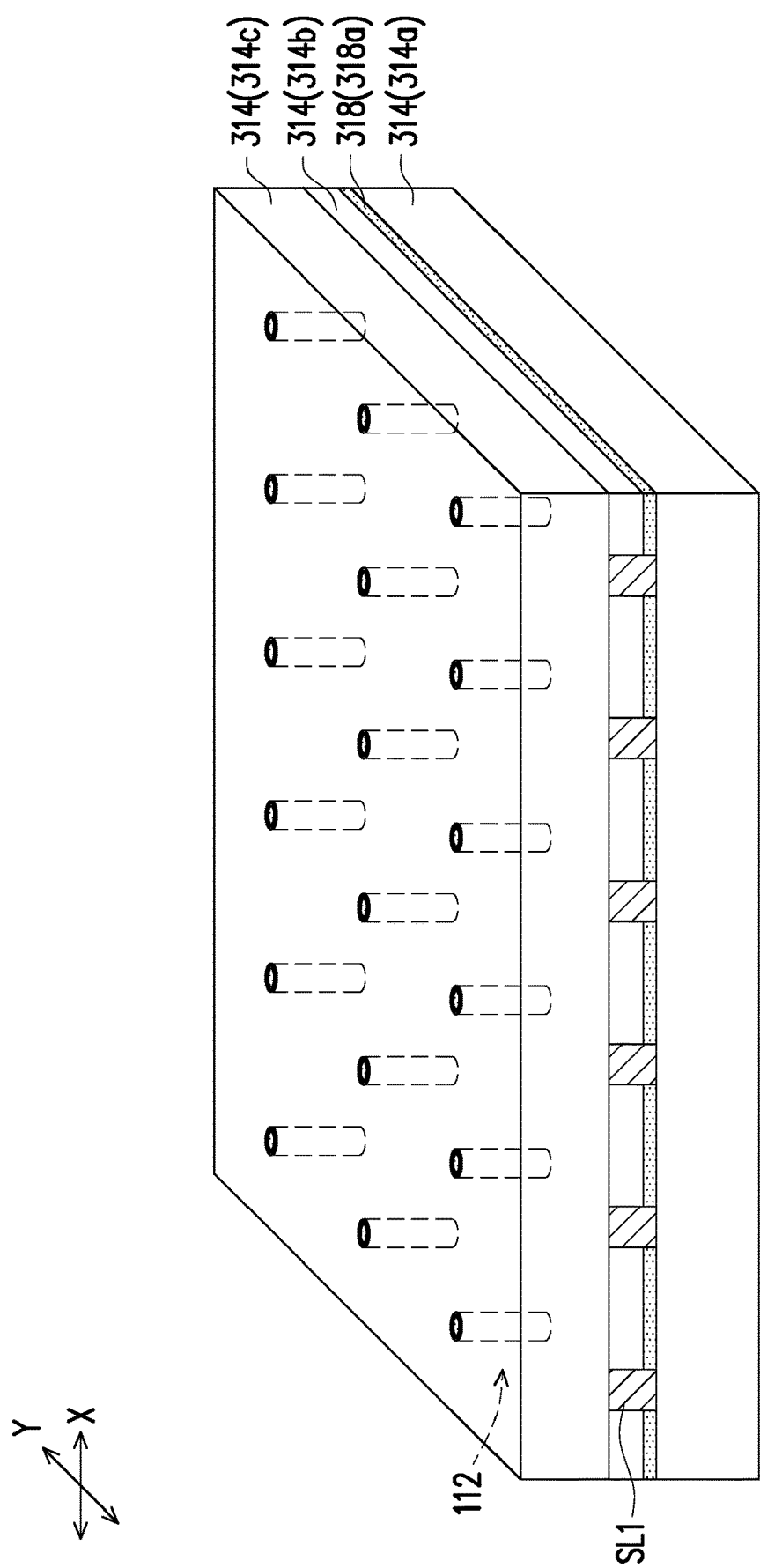

Referring to FIG. 4 and FIG. 5J, step S118 is performed, and another one of the interlayer dielectric layers 314 (referred as an interlayer dielectric layer 314*c* hereinafter) is formed around the pillar structures 112. The pillar structures 112 are laterally surrounded by the interlayer dielectric layer 314*c*, and the previously exposed top surfaces of the interlayer dielectric layer 314*b* and the first signal lines SL1 are covered by the interlayer dielectric layer 314*c*. In some embodiments, top surfaces of the pillar structures 112 are substantially coplanar with a top surface of the interlayer dielectric layer 314*c*. A method for forming the interlayer dielectric layer 314*c* may include providing a dielectric material on the structure shown in FIG. SI by a deposition process, such as a CVD process. Subsequently, portions of the dielectric material above the top surfaces of the pillar structures 112 are removed by a planarization process, and remained portions of the dielectric material form the interlayer dielectric layer 314*c*. For instance, the planarization process may include a polishing process, an etching process (e.g., an isotropic etching process) or a combination thereof.

Figure 5K:
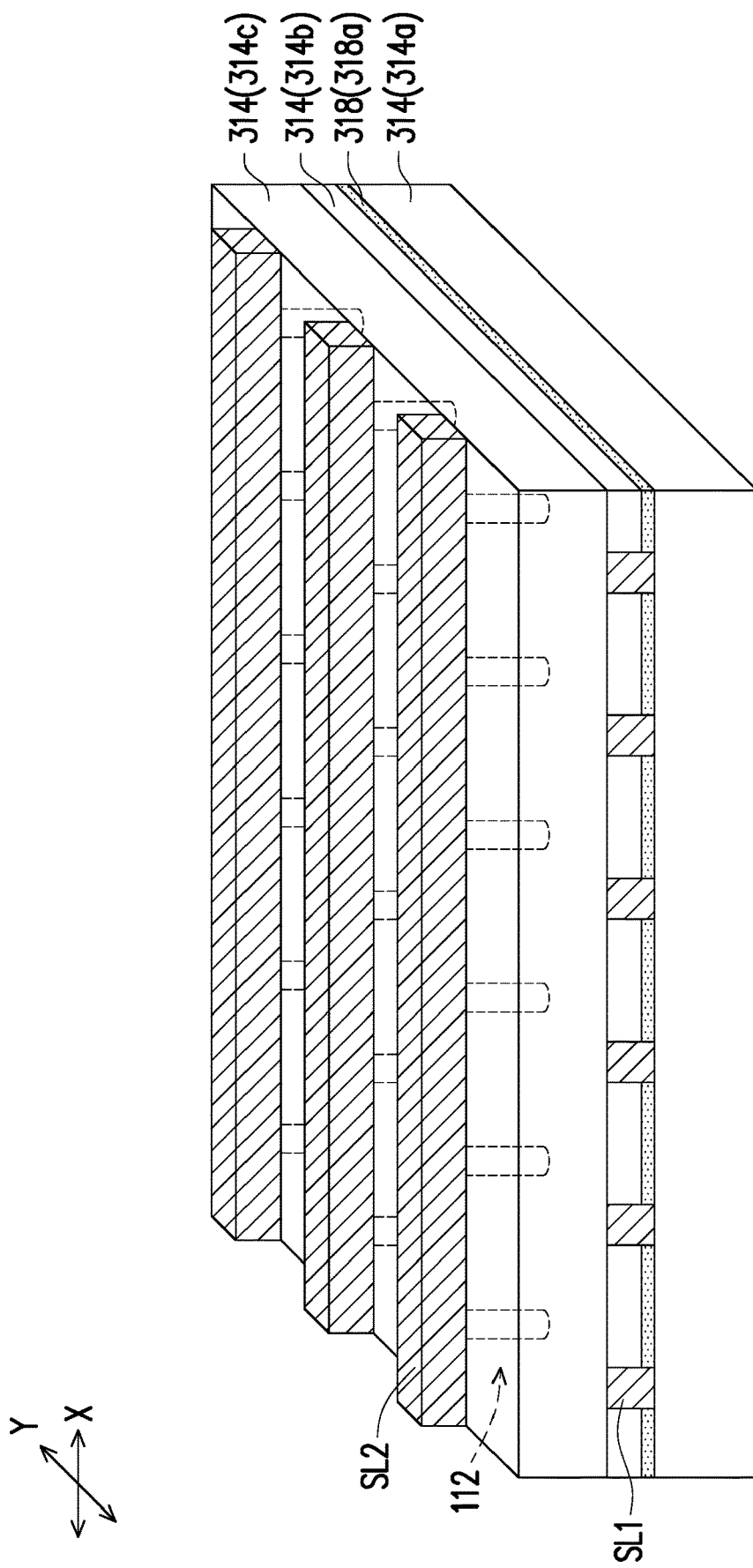

Referring to FIG. 4 and FIG. 5K, step S120 is performed, and the second signal lines SL2 are formed on the current structure. The second signal lines SL2 may extend along the direction X on the interlayer dielectric layer 314*c*, and each electrically connect to a row of the pillar structures 112. In some embodiments, a method for forming the second signal lines SL2 includes globally forming a conductive layer on the structure as shown in FIG. 5J by a deposition process, a plating process or a combination thereof. Thereafter, the conductive layer is patterned to form the second signal lines SL2 by a lithography process and at least one etching process. In these embodiments, the top surfaces of the pillar structures 112 can remain covered, thus can be prevented from being damaged by an etching process.

Figure 5L:
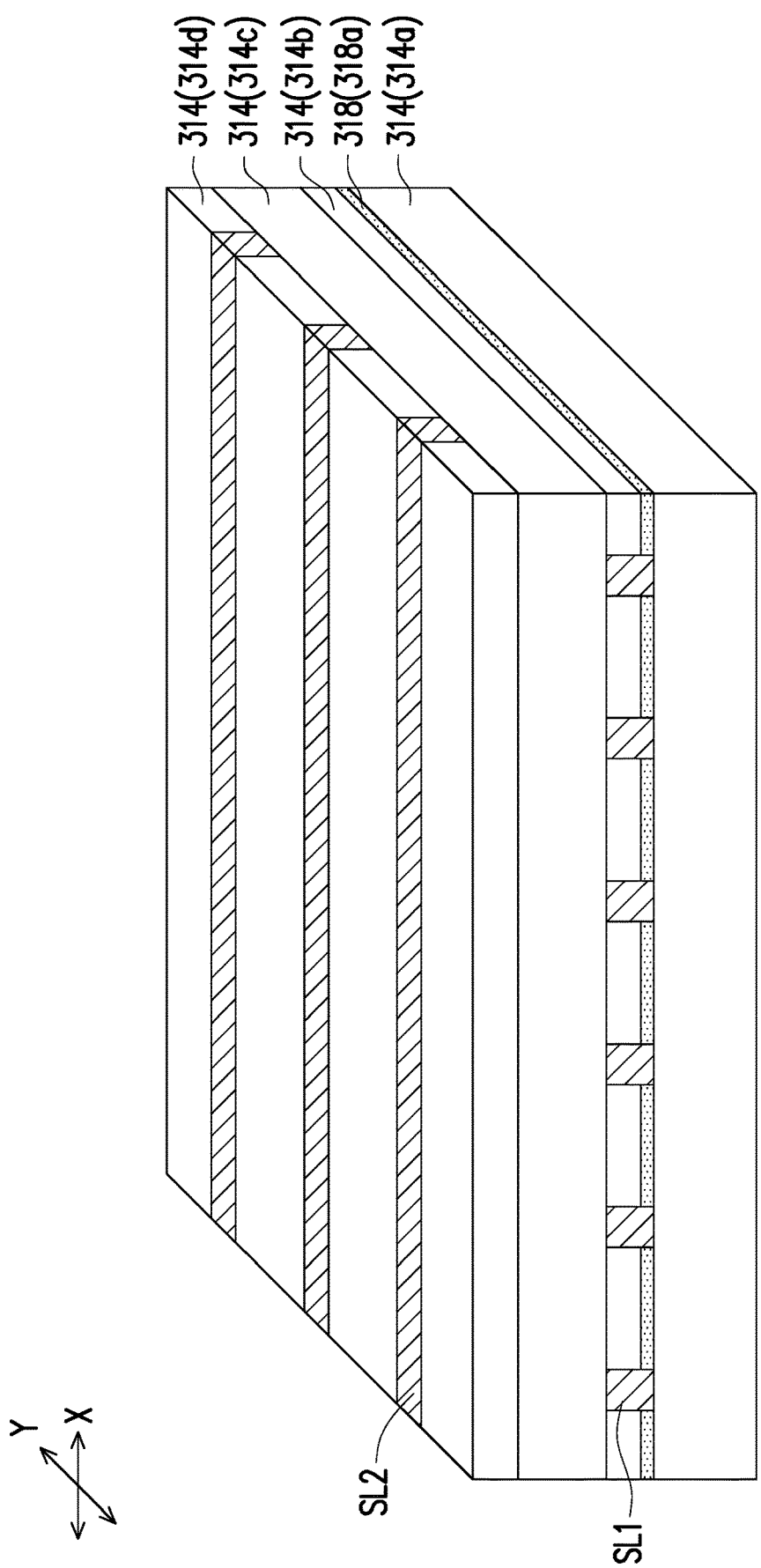

Referring to FIG. 4 and FIG. 5L, step S122 is performed, and an additional one of the interlayer dielectric layers 314 (referred as an interlayer dielectric layer 314*d* hereinafter) is formed around the second signal lines SL2. The second signal lines SL2 may be laterally surrounded by the interlayer dielectric layer 314*d*. In some embodiments, a top surface of the interlayer dielectric layer 314*d* is substantially coplanar with top surfaces of the second signal lines SL2. A method for forming the interlayer dielectric layer 314*d* may include globally providing a dielectric material on the structure as shown in FIG. 5K by a deposition process, such as a CVD process. Subsequently, portions of the dielectric material above the top surfaces of the second signal lines SL2 are removed by a planarization process, and remained portions of the dielectric layer form the interlayer dielectric layer 314*d*. For instance, the planarization process may include a polishing process, an etching process or a combination thereof. Since the top surfaces of the pillar structures 112 remain covered by the second signal lines SL2, possible damages on the top surfaces of the pillar structures 112 during formation of the interlayer dielectric layer 314*d* may be avoided.

Up to here, the memory array 10 as described with reference to FIG. 1A, FIG. 1B, FIG. 2A and FIG. 2B has been formed in a stack of interlayer dielectric layer 314 (i.e., the interlayer dielectric layers 314*a*-314*d*). Further BEOL process as well as packaging process may be performed on the current structure, for completing manufacturing of a semiconductor chip.

Figure 6A:
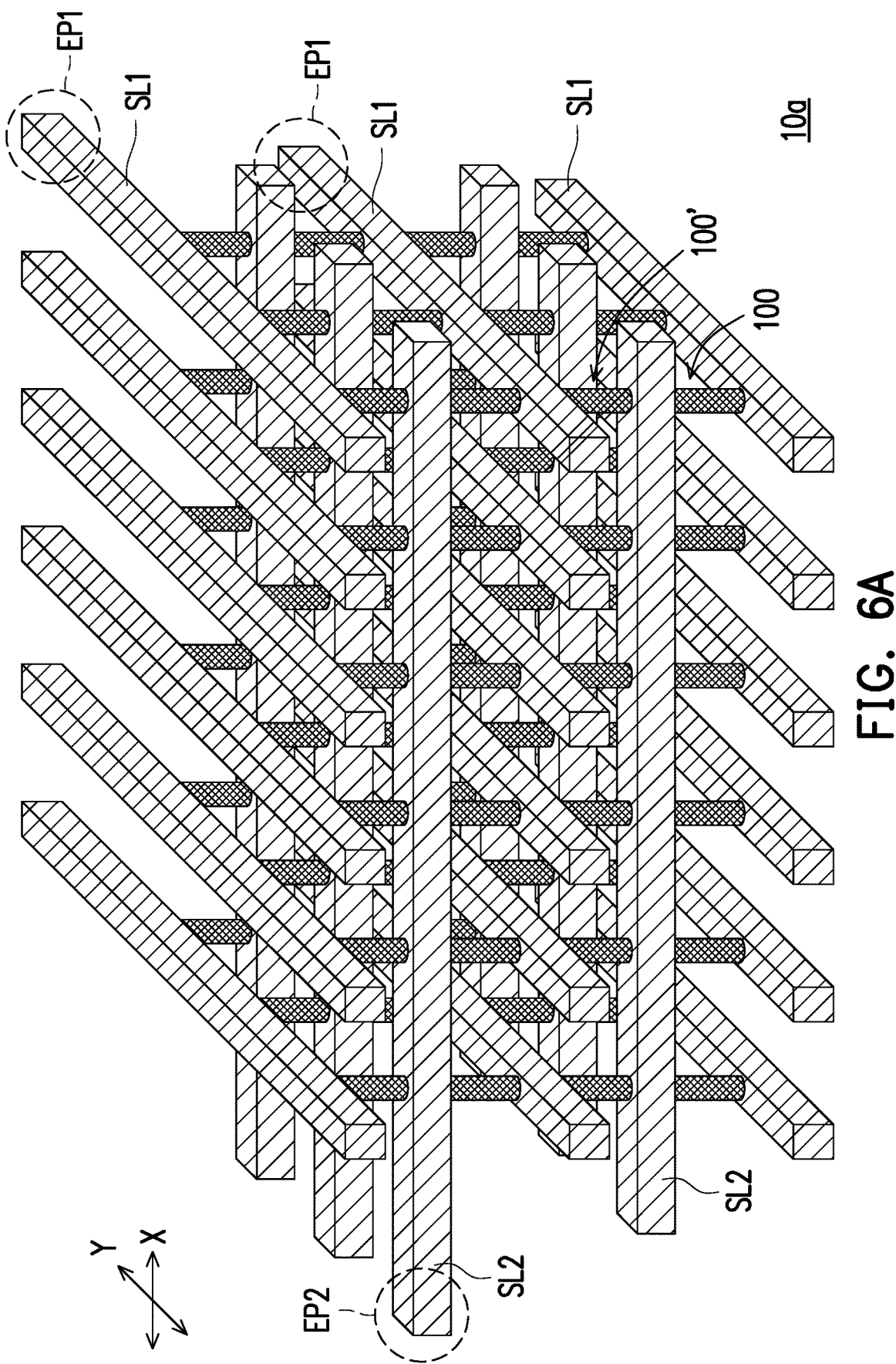
FIG. 6A is a schematic three-dimensional view illustrating a memory array, according to some embodiments of the present disclosure.
Figure 6B:
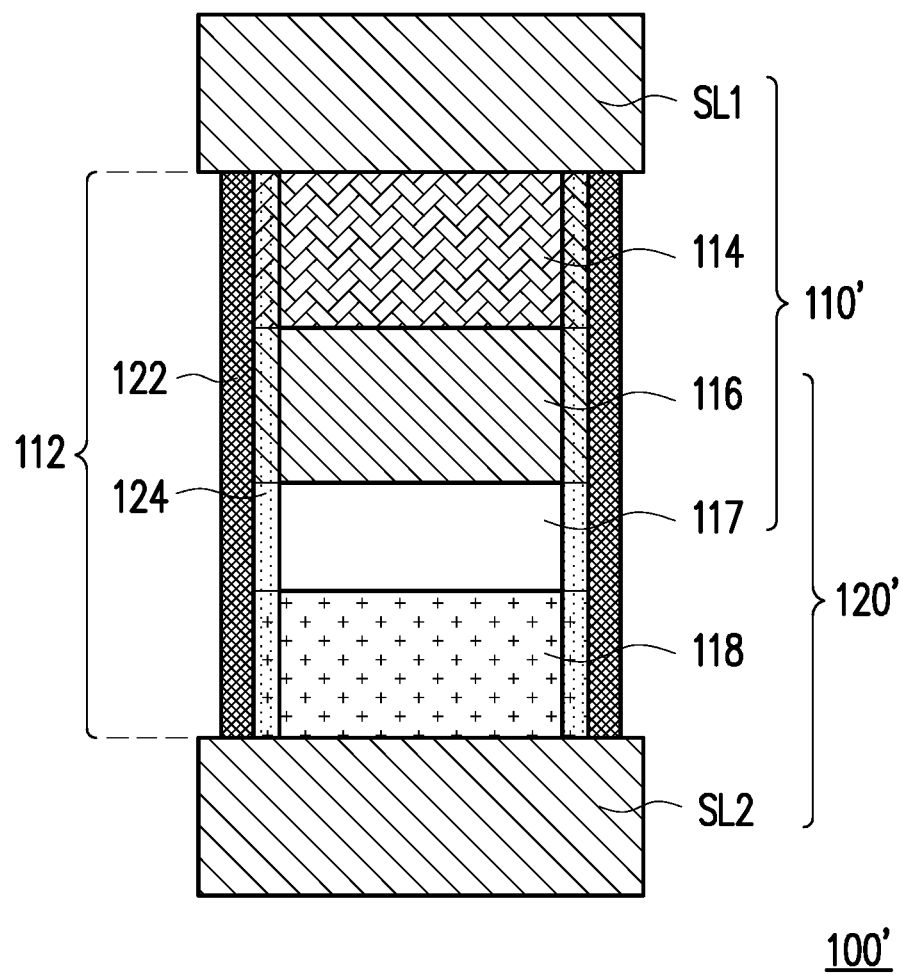
FIG. 6B is a schematic cross-sectional view of one of the memory cells in the memory array as shown in FIG. 6A.

FIG. 6A is a schematic three-dimensional view illustrating a memory array 10*a* according to some embodiments of the present disclosure. FIG. 6B is a schematic cross-sectional view of one of the memory cells 100' as shown in FIG. 6A.

The memory array 10 as shown in FIG. 1A includes the memory cells 100 at a single horizontal level and connected to vertically separated first and second signal lines SL1, SL2. On the other hand, the memory array 10*a* as shown in FIG. 6A has multiple horizontal levels. As shown in FIG. 6A, layers each having an array of the memory cells 100 and layers each having an array of memory cells 100' may be alternately stacked along a vertical direction. In some embodiments, the memory cells 100 in a layer are substantially aligned with the memory cells 100' in an adjacent layer. In addition to the memory cells 100, 100', layers of the first signal lines SL1 and layers of the second signal lines SL2 may be alternately stacked along the vertical direction as well. Each layer of the memory cells 100 are defined between an underlying layer of the first signal lines SL1 and an overlying layer of the second signal lines SL2. On the other hand, each layer of the memory cells 100' are defined between an underlying layer of the second signal lines SL2 and an overlying layer of the first signal lines SL1. Further, the layers of the first and second signal lines SL1, SL2 located between the layers of the memory cells 100, 100' are shared by the memory cells 100, 100'.

The memory cells 100' are similar to the memory cells 100, except that a stacking order of layers in each memory cell 100' may be opposite to a stacking order of layers in each memory cell 100. As described with reference to FIG. 2A, the resistance variable layer 114, the electrode layer 116, the adhesive layer 117 (optional) and the switching layer 118 in each memory cell 100 are sequentially stacked from a top side of a first signal line SL1 to a bottom side of a second signal line SL2. On the other hand, as shown in FIG. 6B, the switching layer 118, the adhesive layer 117 (optional), the electrode layer 116 and the resistance variable layer 114 may be sequentially stacked from a top side of a second signal line SL2 to a bottom side of a first signal line SL1. A resistance variable element 110' in the memory cell 100', which is similar to the resistance variable element 110 in the memory cell 100 as described with reference to FIG. 1B and FIG. 2A, is defined by the first signal line SL1, the resistance variable layer 114, the electrode layer 116 and the adhesive layer 117 (optional). In addition, a selector 120' in the memory cell 100', which is similar to the selector 120 in the memory cell as described with reference to FIG. 1B and FIG. 2A, is defined by the second signal line SL2, the switching layer 118, the adhesive layer 117 (optional) and the electrode layer 116, and is connected to the resistance variable element 110' from below the resistance variable element 110'.

Referring to FIG. 6A, in some embodiments, end portions of the first signal lines SL1 in an upper layer are laterally protruded from end portions of the first signal lines SL1 in a lower layer, such that the first signal lines SL1 in the upper layer have end portions EP1 not overlapped with the first signal lines SL1 in the lower layer. In this way, the first signal lines SL1 in the upper layer can be out-routed from these end portions EP1, and each layer of the first signal lines SL1 can be independently controlled. Similarly, end portions of the second signal lines SL2 in an upper layer may be laterally protruded from end portions of the second signal lines SL2 in a lower layer, such that the second signal lines SL2 in the upper layer may have end portions EP2 not overlapped with the second signal lines SL2 in the lower layer. In this way, the second signal lines SL2 in the upper layer can be out-routed from these end portions EP2, and each layer of the second signal lines SL2 can be independently controlled.

As similar to the memory array 10 as described with reference to FIG. 1A, FIG. 3A and FIG. 3B, the memory array 10a as shown in FIG. 6A may be embedded in a BEOL structure of a semiconductor chip as well, and may be routed to active devices in a FEOL structure lying below the BEOL structure in the semiconductor chip.

As being deployed along the vertical direction, the memory array 10a is no longer limited to two-dimensional design, and storage density can be significantly increased without increasing a footprint area of the memory array 10a. Each horizontal level of the memory array 10a may be defined by a layer of the memory cells 100/100' and the layers of the first and second signal lines SL1, SL2 connected thereto. Although the memory array 10a is depicted as having four horizontal levels, those skilled in the art may adjust an amount of the horizontal levels of the memory array 10a. For instance, the memory cell 10a may have two to ten horizontal levels.

Figure 7:
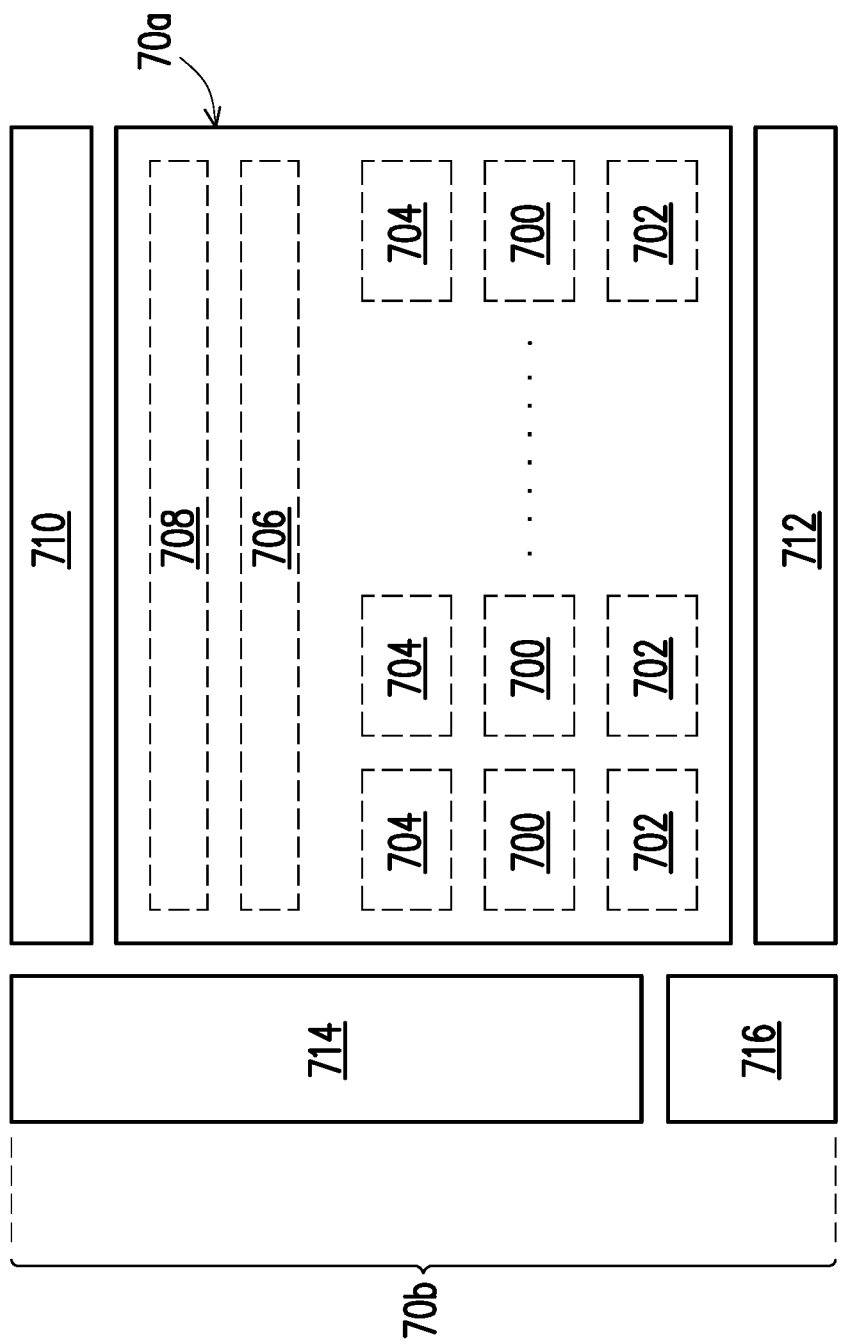
FIG. 7 is a block diagram illustrating an arrangement of a memory array and a driving circuit lying below the memory array, according to some embodiments of the present disclosure.

FIG. 7 is a block diagram illustrating an arrangement of a memory array 70a and a driving circuit 70b lying below the memory array 70a, according to some embodiments of the present disclosure.

Referring to FIG. 7, the memory array 70a may be the memory array 10 as described with reference to FIG. 1A, or the memory array 10a as described with reference to FIG. 6A. The memory array 70a lies above the driving circuit 70b in a semiconductor chip. As similar to the memory array 10 as described with reference to FIG. 3A and FIG. 3B, the memory array 70a may be embedded in a BEOL structure. On the other hand, active devices of the driving circuit 70b may be formed in a FEOL structure lying below the BEOL structure, as also described with reference to FIG. 3A and FIG. 3B. Since the memory array 70a can be formed over the FEOL structure, design of the active devices in already crowded FEOL structure may be less limited. Alternatively, more active devices may be integrated in the FEOL structure.

The driving circuit 70 is coupled to the memory array 70a, and configured to drive the memory array 70a. In some embodiments, the driving circuit 70 includes write drivers 700, read drivers 702 and column decoders 704. In some embodiments, the write drivers 700, the read drivers 702 and the column decoders 704 are arranged as an array. The write drivers 700 may each coupled with one to eight word lines, and may be configured to facilitate a write operation. The read drivers 700, such as sense amplifiers, may each coupled with one to 8 bit lines, and may be configured to facilitate a read operation. The word lines may be the second signal lines SL2, and the bit lines may be the first signal lines SL1. Alternatively, the word lines may be the first signal lines SL1, while the bit lines may be the second signal lines SL2. The column decoders 704 may be coupled to the write drivers 700 and the read drivers 702, and may be configured to perform column selection.

In addition, the driving circuit 70b further includes a row decoder 706 and a word line driver 708. The row decoder 706 may be coupled with the column decoders 704, and may be configured to perform row selection. The word line driver 708 may be coupled with the word lines (i.e., the first or second signal lines SL1/SL2), and configured to provide write current/voltage to the word lines. In some embodiments, the write drivers 700, the read drivers 702, the column decoders 704, the row decoder 706 and the word line driver 708 are overlapped with the overlying memory array 70a, and thus depicted by ghost lines. On the other hand, as to be further described, the driving circuit 70b may further include components located around the overlying memory array 70a.

In those embodiments where the memory array 70a have multiple horizontal levels of memory cells, the driving circuit 70b may further include a layer selection circuit 710. The layer selection circuit 710 may be configured to perform a layer selection, for determining which horizontal level of the memory array 70a is subjected to a write/read operation. Furthermore, the driving circuit 70b may further include an error correction circuit (ECC) 712, a charge pumping circuit 714 and a timing control circuit 716. The ECC 712 may be configured to perform correction of errors in stored data stored. The charge pumping circuit 714 may be configured to provide possibly required large current/voltage for a write operation. Further, the timing control circuit 716 may be configured to sequence operations of multiple sub-arrays in the memory array 70a. As mentioned above, the layer selection circuit 710, the ECC 712, the charge pumping circuit 714 and the timing control circuit 716 may be disposed within a region of the FEOL structure not overlapped with the overlying memory array 70a. In some embodiments, the layer selection circuit 710, the ECC 712, the charge pumping circuit 714 and the timing control circuit 716 laterally surround a region of the FEOL structure that is overlapped with the overlying memory array 70a (e.g., the region in which components including the write drivers 700, the read drivers 702, the column decoders 704, the row decoder 706 and the word line driver 708 are disposed).

However, those skilled in the art may modify the driving circuit 70b according to design requirements. The present disclosure is not limited to the components and/or arrangement of the components in the driving circuit 70b.

As above, the memory array according to embodiments of the present disclosure includes memory cells defined at intersections (or referred as cross-points) of signal lines running at different horizontal levels. The memory cells each include a pillar structure having functional layers stacked along a vertical direction. These functional layers along with the overlying and underlying signal lines define a resistance variable element and a selector connected to the resistance variable element by a shared terminal. In addition, each memory cell further includes a carbon containing dielectric layer laterally surrounding a stacking structure of the functional layers. Thereby, the selector and the resistance variable element in a memory cell can be spaced apart from the selector and the resistance variable element in an adjacent memory cell with the carbon containing dielectric layers of these memory cells in between. The carbon containing dielectric layer has an ultra low dielectric constant, thus a parasitic capacitance between adjacent memory cells can be effectively lowered. Accordingly, RC delay in the memory array can be reduced. Moreover, the carbon containing dielectric layer may protect the stacking structure from damages caused by moisture and etchants during manufacturing of the memory array. Therefore, a queue time during the manufacturing of the memory array can be less limited.

In an aspect of the present disclosure, a memory array is provided. The memory array comprises: first signal lines, extending along a first direction; second signal lines, extending along a second direction over the first signal lines; and memory cells, defined at intersections of the first and second signal lines, and respectively comprising: a resistance variable layer; a switching layer, overlapped with the resistance variable layer; an electrode layer, lying between the resistance variable layer and the switching layer; and a carbon containing dielectric layer, laterally surrounding a stacking structure comprising the resistance variable layer, the switching layer and the electrode layer.

In another aspect of the present disclosure, a method for manufacturing a memory array is provided. The method comprises: forming first signal lines in trenches of a first dielectric layer; forming stacking structures on the first signal lines, wherein the stacking structures are laterally separated from one another, and each of the stacking structures comprises a resistance variable layer, a switching layer and an electrode layer lying between the resistance variable layer and the switching layer; forming a carbon containing dielectric layer covering exposed surfaces of the first dielectric layer, the first signal lines, and the stacking structures; removing portions of the carbon containing dielectric layer extending along a top surface of the first dielectric layer, top surfaces of the first signal lines and top surfaces of the stacking structures; forming a second dielectric layer spanning between pillar structures each comprising one of the stacking structures and a remained portion of the carbon containing dielectric layer laterally surrounding the one of the stacking structures; and forming second signal lines on the second dielectric layer and the pillar structures, wherein the pillar structures are located at intersections of the first and second signal lines.

In yet another aspect of the present disclosure, a semiconductor chip is provided. The semiconductor chip comprises: a substrate; active devices, formed at a surface of the substrate; a stack of dielectric layers, formed on the surface of the substrate, and covering the active devices; and a memory array, embedded in the dielectric layers, and comprising: first signal lines; second signal lines, running over and intersected with the first signal lines; and memory cells defined at intersections of the first and second signal lines, and respectively comprising a pillar structure with a carbon containing dielectric layer defining a sidewall of the pillar structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising
first signal lines, extending along a first direction;
second signal lines, extending along a second direction over the first signal lines; and
memory cells, defined at intersections of the first and second signal lines, and respectively comprising:
 a resistance variable layer;
 a switching layer, overlapped with the resistance variable layer;
 an electrode layer, lying between the resistance variable layer and the switching layer; and
 a carbon containing dielectric layer, laterally surrounding a stacking structure comprising the resistance variable layer, the switching layer and the electrode layer.

2. The memory array according to claim 1, wherein a dielectric constant of the carbon containing dielectric layer is less than 2, and substantially equal to or greater than 1.5.

3. The memory array according to claim 1, further comprising a dielectric layer spanning between pillar structures each comprising the stacking structure and the carbon containing dielectric layer in one of the memory cells, and a dielectric constant of the carbon containing dielectric layer in each memory cell is less than a dielectric constant of the dielectric layer.

4. The memory array according to claim 1, wherein the carbon containing dielectric layer is porous.

5. The memory array according to claim 1, wherein the carbon containing dielectric layer is amorphous.

6. The memory array according to claim 1, wherein the carbon containing dielectric layer is formed of an oxide dielectric material comprising Si, C, O and H.

7. The memory array according to claim 1, wherein the stacking structure of each memory cell has a nitridation region laterally extending into the stacking structure from a sidewall of the stacking structure.

8. The memory array according to claim 1, wherein a resistance variable element in each memory cell is defined by the electrode layer, the resistance variable layer and an underlying one of the first signal lines, and a two-terminal selector in each memory cell is defined by the electrode layer, the switching layer and an overlying one of the second signal lines.

9. The memory array according to claim 1, wherein the stacking structure in each memory cell further comprises an adhesive layer lying between the electrode layer and the switching layer.

10. The memory array according to claim 8, wherein the adhesive layer is formed of a conductive material.

11. A method for manufacturing a memory array, comprising:
forming first signal lines in trenches of a first dielectric layer;
forming stacking structures on the first signal lines, wherein the stacking structures are laterally separated from one another, and each of the stacking structures comprises a resistance variable layer, a switching layer and an electrode layer lying between the resistance variable layer and the switching layer;

forming a carbon containing dielectric layer covering exposed surfaces of the first dielectric layer, the first signal lines, and the stacking structures;

removing portions of the carbon containing dielectric layer extending along a top surface of the first dielectric layer, top surfaces of the first signal lines and top surfaces of the stacking structures;

forming a second dielectric layer spanning between pillar structures each comprising one of the stacking structures and a remained portion of the carbon containing dielectric layer laterally surrounding the one of the stacking structures; and forming second signal lines on the second dielectric layer and the pillar structures, wherein the pillar structures are located at intersections of the first and second signal lines.

12. The method for manufacturing the memory array according to claim 11, wherein a method for forming the stacking structures comprises:

forming a resistance variable material layer, an electrode material layer and a switching material layer on the first dielectric layer and the first signal lines;

forming mask patterns on stacking layers comprising the resistance variable material layer, the electrode material layer and the switching material layer;

performing an etching process, to remove portions of the stacking layers around the mask patterns, wherein remained portions of the resistance variable material layer respectively form the resistance variable layer in each stacking structure, remained portions of the electrode material respectively form the electrode layer in each stacking structure, and remained portions of the switching material respectively form the switching layer in each stacking structure; and removing the mask patterns.

13. The method for manufacturing the memory array according to claim 12, wherein formation of the carbon containing dielectric layer is performed in an etching apparatus used for performing the etching process.

14. The method for manufacturing the memory array according to claim 13, wherein a hydrocarbon source gas is provided into the etching apparatus, then ionized and deposited on the exposed surfaces of the first dielectric layer, the first signal lines, and the stacking structures during formation of the carbon containing dielectric layer.

15. The method for manufacturing the memory array according to claim 12, further comprising performing a plasma cleaning process on the stacking structures, the first dielectric layer and the first signal lines before formation of the carbon containing dielectric layer and after formation of the stacking structures.

16. The method for manufacturing the memory array according to claim 15, wherein the plasma cleaning process is performed in an etching apparatus for performing the etching process.

17. The method for manufacturing the memory array according to claim 11, wherein a method for forming the second signal lines comprises:

forming a conductive layer on the second dielectric layer and the pillar structures; and removing portions of the conductive layer, such that remained portions of the conductive layer form the second signal lines.

18. A semiconductor chip, comprising:

a substrate;

active devices, formed at a surface of the substrate;

a stack of dielectric layers, formed on the surface of the substrate, and covering the active devices; and a memory array, embedded in the dielectric layers, and comprising:

first signal lines;

second signal lines, running over and intersected with the first signal lines; and memory cells defined at intersections of the first and second signal lines, and respectively comprising a pillar structure with a carbon containing dielectric layer defining a sidewall of the pillar structure.

19. The semiconductor chip according to claim 18, wherein a dielectric constant of the carbon containing dielectric layer in each memory cell is less than a dielectric constant of the dielectric layers.

20. The semiconductor chip according to claim 18, wherein at least a portion of the active devices are overlapped with the memory array.

* * * * *